(12) United States Patent
Hasegawa et al.

(10) Patent No.: US 7,852,891 B2
(45) Date of Patent: Dec. 14, 2010

(54) NITRIDE SEMICONDUCTOR LIGHT-EMITTING DEVICE

(75) Inventors: Yoshiaki Hasegawa, Katano (JP); Toshiya Yokogawa, Nara (JP); Akihiko Ishibashi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/258,881

(22) Filed: Oct. 27, 2008

(65) Prior Publication Data

US 2009/0059983 A1 Mar. 5, 2009

Related U.S. Application Data

(62) Division of application No. 11/084,526, filed on Mar. 21, 2005, now Pat. No. 7,501,667.

(30) Foreign Application Priority Data

Jun. 8, 2004 (JP) ............................. 2004-170221

(51) Int. Cl.
H01S 5/00 (2006.01)
(52) U.S. Cl. ............... 372/44.01; 372/43.01; 372/45.01
(58) Field of Classification Search .............. 372/43.01, 372/44.01
See application file for complete search history.

(56) References Cited

U.S. PATENT DOCUMENTS

| 6,555,845 B2 | 4/2003 | Watanabe et al. | |
| 2002/0031153 A1* | 3/2002 | Niwa et al. | 372/45 |
| 2004/0164308 A1 | 8/2004 | Tsunenori et al. | |
| 2005/0227392 A1 | 10/2005 | Tsunenori et al. | |

FOREIGN PATENT DOCUMENTS

| CN | 1354528 | 6/2002 |
| JP | 10-242586 | 9/1998 |
| JP | 11-224969 A | 8/1999 |
| JP | 2000-277437 | 10/2000 |
| JP | 2000-323752 | 11/2000 |
| JP | 2001-267692 | 9/2001 |
| JP | 2002-076518 A | 3/2002 |

(Continued)

OTHER PUBLICATIONS

M. Ikeda, et al. "Blue-Violet Laser Diodes Suitable for Blu-ray Disk" phys. Stat. sol. (a) 194, No. 2, pp. 407-413, (2002).

(Continued)

Primary Examiner—Minsun Harvey
Assistant Examiner—Xnning Niu
(74) Attorney, Agent, or Firm—McDermott Will & Emery LLP

(57) ABSTRACT

A nitride semiconductor light-emitting device is provided including: a substrate made of a nitride semiconductor; a semiconductor layer made of a nitride semiconductor containing a p-type impurity, the semiconductor layer being formed as contacting an upper surface of the substrate; a first cladding layer made of a nitride semiconductor containing an impurity of a first conductivity type, the first cladding layer being formed on the semiconductor layer; an active layer formed on the first cladding layer; and a second cladding layer made of a nitride semiconductor containing an impurity of a second conductivity type, the second cladding layer being formed on the active layer.

10 Claims, 17 Drawing Sheets

FOREIGN PATENT DOCUMENTS

| | | |
|---|---|---|
| JP | 2002-124737 A | 4/2002 |
| JP | 2002-141613 | 5/2002 |
| JP | 2002-217498 | 8/2002 |
| JP | 2002-367909 | 12/2002 |
| JP | 2003-110197 | 4/2003 |
| JP | 2003-110197 A | 4/2003 |
| JP | 2003-124572 | 4/2003 |
| JP | 2003-124572 A | 4/2003 |
| JP | 2003-133648 | 5/2003 |
| JP | 2003-133649 | 5/2003 |
| JP | 2003-133649 A | 5/2003 |

OTHER PUBLICATIONS

S. Tomiya, et al. "Dislocations in GaN-Based Laser Diodes on Epitaxial Lateral Overgrown GaN Layers" phys. stat. sol. (a) 188, No. 1, pp. 69-72 (2001).

Chinese Office Action issued in corresponding Chinese Patent Application No. 2005100751406 dated Dec. 1, 2006.

Japanese Office Action issued in corresponding Japanese Patent Application No. 2004-170221 dated Jun. 14, 2005.

O. Matsumoto, et al. "Extremely Long Lifetime Blue-violet Laser Diodes Grown Homoepitaxially on GaN Substrates" Extended Abstracts of the 2002 International Conference on Solid State Devices and Materials, Nagoya, 2002, pp. 832-833.

Shin-ichi Nagahama, et al. "High-Power and Long-Lifetime InGaN Multi-Quantum-Well Laser Diodes Grown on Low-Dislocation-Density GaN Substrates" Jpn. J. Appl. Phys. vol. 39 (2000) pp. L647-L650, Part 2, No. 7A, Jul. 1, 2000.

* cited by examiner

NITRIDE SEMICONDUCTOR LIGHT-EMITTING DEVICE

RELATED APPLICATIONS

This application is a Divisional of U.S. application Ser. No. 11/084,526, filed Mar. 21, 2005, now U.S. Pat. No. 7,501,667 claiming priority of Japanese Application No. 2004-170221, filed Jun. 8, 2004, the entire contents of each of which are hereby incorporated by reference.

BACKGROUND OF THE INVENTION

1. Field of the Invention

The present invention relates to nitride semiconductor light-emitting devices including GaN-based light-emitting devices.

2. Description of the Related Art

Recently, the Blue-ray Disc has been released as a coming-generation high-density optical disk. The Blue-ray Disc uses a semiconductor laser, which emits blue-violet light, as a light source. In such a semiconductor laser a gallium nitride (GaN)-based III-V compound semiconductor is used as a semiconductor material. In light of the future development the Blue-ray Disc calls for high-density and high-speed recording capability. For this reason a GaN-based semiconductor laser exhibiting high optical output and high reliability will be needed for use with the Blue-ray Disc.

In prolonging the lifetime of such a GaN-based semiconductor laser, reduction in power consumption and in dislocation density is critical. According to the teaching of S. Tomiya et. al, Phys. Stat. Sol. (a), 188 (2001)69. (non-patent document 1) for example, the reduction in power consumption has a close correlation with prolongation of the lifetime of a GaN-based semiconductor laser. S. Nagahama et. al, Jpn. J. Appl. Phys., 39 (2000)L647 (non-patent document 2) and M. Ikeda et. al, Phys. Stat. Sol. (a), 194 (2002) 407 (non-patent document 3) have suggested that the reduction in dislocation density is effective in prolongation of lifetime. Both of non-patent documents 2 and 3 use a sapphire substrate, grow a GaN film on the sapphire substrate, form an insulating film on a portion of the GaN film, and grow a GaN film again. The GaN film grown again begins to grow selectively from a region not formed with the insulating film and then grows laterally to protrude over the insulating film. This technique is called epitaxial lateral overgrowth (ELO.)

In such an ELO region, propagation of threading dislocation caused by the difference in physical constant between sapphire and GaN toward the surface of the GaN film is suppressed and, hence, a low dislocation-density region is formed. The dislocation density of such a low dislocation-density region is about $10^6$ cm$^{-2}$. On the other hand, a high dislocation-density region out of the ELO region has a dislocation density of about $10^8$ cm$^{-2}$, which is higher than that of the low dislocation-density region by about two orders of magnitude. For the pursuit of a prolonged lifetime under high-temperature and high-output conditions, however, the dislocation density of about $10^6$ cm$^{-2}$, which is presently attainable, is insufficient and a further reduction in dislocation will be needed. Since a sapphire substrate has an insulating property, electrodes of a semiconductor laser cannot be disposed on the substrate side. For this reason, a GaN-based laser formed on the sapphire substrate utilizing the ELO technique has p-electrode and n-electrode both disposed on the GaN side. This structure increases the device size, hence, decreases the number of devices to be obtained from a single substrate. Further, the structure calls for a complicated fabrication process, which results in problems of decreased yield and increased fabrication cost.

In attempt to solve the aforementioned problems, an electrically conductive (n-type) GaN substrate has recently begun being fabricated and released. In each of Japanese Patent Laid-Open Publications No. 2003-124572 (patent document 1) and No. 2003-133649 (patent document 2) for example, there is disclosed a method of fabricating a self-contained GaN substrate, which includes: growing a thick GaN film on a support substrate of sapphire for example by utilizing the aforementioned ELO technique; removing the support substrate by polishing; and slicing and mirror-finishing the thick GaN crystal film. Since the ELO technique is utilized in the fabrication of such a GaN substrate, the substrate has a low dislocation-density region and a high dislocation-density region. The low dislocation-density region has a dislocation density lowered to about $10^5$ cm$^{-2}$. Further, attempts have been made to fabricate a GaN-based laser on such a GaN substrate. According to the teaching of O. Matsumoto et. al, Extended Abstracts of the 2002 Int. Conf. on Solid State Devices and Materials, pp. 832-833 (non-patent document 4), a GaN-based laser fabricated on a GaN substrate having a low dislocation density (about $3 \times 10^5$ cm$^{-2}$) is expected to enjoy a considerably prolonged lifetime estimated to be about 100,000 hours.

In an attempt to solve problems, including substrate warpage and crystalline defect, common to all the types of substrates, Japanese Patent Laid-Open Publication No. 2003-110197 (patent document 3) has disclosed a technique wherein a first buffer layer of GaN having plural trenches at its surface is formed directly on a substrate and then a second buffer layer of GaN doped with magnesium (Mg) is formed on the first buffer layer.

SUMMARY OF THE INVENTION

Where a GaN substrate is used as a substrate for a GaN-based laser, it is necessary to solve the following two problems:

(1) increased noise of the laser due to light leaking from the active layer toward the GaN substrate side (stray light); and (2) degraded laser characteristics and decreased yield due to unevenness on the surface of the GaN substrate.

These problems will be described more specifically.

With regard to the problem (1), the Blue-ray Disc uses small laser light energy (wavelength) relative to the band gap energy of the GaN substrate. Accordingly, where the GaN substrate is used as a substrate for a GaN-based laser, laser light emitted from the active layer and propagated toward the substrate side passes within the substrate without being absorbed in the substrate and then leaks out of the substrate. Such light leaking out of the substrate (stray light) contains a spontaneous emission light component and hence becomes quantum noise serving as an impediment to the reduction in the noise of the laser.

With regard to the problem (2), presently a GaN substrate as mentioned above is formed by slicing a thick GaN crystal film to obtain a substrate and then mirror-finishing the surface of the substrate. Such a presently-available GaN substrate, however, is more difficult to etch by wet etching than a substrate of any other III-V compound semiconductor such as gallium arsenide (GaAs) or indium phosphide (InP). For this reason, wet etching on the GaN substrate neither exercises a sufficient cleaning effect on the substrate surface nor achieves an effective planarization of unevenness on the substrate surface due to polishing flaw such as scratch. Accordingly, when GaN-based crystal and a GaN-based laser are grown on the GaN substrate, unevenness results on the surface of GaN crystal grown. Where a miniature structure such as a quantum well structure for example is grown on such an uneven surface, such unevenness causes a nonuniform distribution of the thickness of the quantum well layer to occur and hence makes the device characteristics, such light-emitting characteristics, nonuniform. In the case of a laser, such unevenness results in degradation in laser characteristics, in-plane nonuniformity, and reduction in yield. Thus, a technique for planarizing GaN-based crystal is very important in growing such GaN-based crystal on a GaN substrate.

Though the patent document 3 mentions a case where a substrate of GaN is used, the technique of this document needs to form the first buffer layer of GaN having plural trenches at its surface directly on the substrate and then form the second buffer layer of GaN doped with magnesium (Mg) on the first buffer layer and hence takes a relatively long time for the process step of stacking the buffer layers on the substrate. Thus, the technique of the document cannot obviate complication in the fabrication process, reduction in yield or increase in cost.

An object of the present invention is to provide a nitride semiconductor light-emitting device such as a GaN-based light-emitting device fabricated by crystal growth on a GaN substrate, particularly a GaN-based laser which realizes reduction in noise by reducing light leaking out of the substrate (stray light), which ensures improved laser characteristics and improved yield by facilitating planarization of the crystal surface of the laser, and which can enjoy a prolonged lifetime even under high temperature and high output operating conditions.

In order to attain this object, the present invention provides a nitride semiconductor light-emitting device comprising: a substrate comprising a nitride semiconductor; a semiconductor layer comprising a nitride semiconductor containing a p-type impurity, the semiconductor layer being formed as contacting an upper surface of the substrate; a first cladding layer comprising a nitride semiconductor containing an impurity of a first conductivity type, the first cladding layer being formed on the semiconductor layer; an active layer formed on the first cladding layer; and a second cladding layer comprising a nitride semiconductor containing an impurity of a second conductivity type, the second cladding layer being formed on the active layer.

In the nitride semiconductor light-emitting device according to the present invention, the semiconductor layer preferably comprises a nitride semiconductor containing Mg. More preferably, the semiconductor layer comprises GaN containing Mg. In this case the substrate preferably comprises GaN.

In the nitride semiconductor light-emitting device according to the present invention, the semiconductor layer preferably has a thickness of not less than 5 nm and not more than 200 nm, more preferably, not less than 5 nm and not more than 100 nm.

The nitride semiconductor light-emitting device according to the present invention may further comprise a first electrode formed under the substrate for example, and a second electrode formed on the second cladding layer.

According to a second aspect of the present invention, there is provided a nitride semiconductor light-emitting device comprising: a substrate comprising a nitride semiconductor; a first cladding layer comprising a nitride semiconductor containing an impurity of a first conductivity type, the first cladding layer being formed on the semiconductor substrate; an active layer formed on the first cladding layer; a second cladding layer comprising a nitride semiconductor containing an impurity of a second conductivity type, the second cladding layer being formed on the active layer; and a semiconductor layer comprising a nitride semiconductor containing a p-type impurity and an n-type impurity and/or carbon (C), the semiconductor layer being formed between the substrate and the active layer.

In the nitride semiconductor light-emitting device according to the second aspect of the present invention, the semiconductor layer is preferably formed between the substrate and the first cladding layer. More preferably, the semiconductor layer is formed as contacting an upper surface of the substrate.

The semiconductor layer may comprise a nitride semiconductor containing Mg and Si for example. Alternatively, the semiconductor layer may comprise a nitride semiconductor containing Mg and C for example. Yet alternatively, the semiconductor layer may comprise a nitride semiconductor containing Mg, Si and C. The nitride semiconductor of the semiconductor layer is preferably GaN. Further, the substrate preferably comprises GaN.

In the nitride semiconductor light-emitting device according to the second aspect of the present invention, the semiconductor layer may comprise a plurality of semiconductor layers. The nitride semiconductor light-emitting device according to the second aspect of the present invention may further comprise a first electrode formed under the substrate for example, and a second electrode formed on an upper surface of the second cladding layer.

The foregoing and other objects, features and attendant advantages of the present invention will become more apparent from the reading of the following detailed description of the preferred embodiments of the invention in conjunction with the accompanying drawings.

DETAILED DESCRIPTION OF THE PREFERRED EMBODIMENTS

Figure 1:
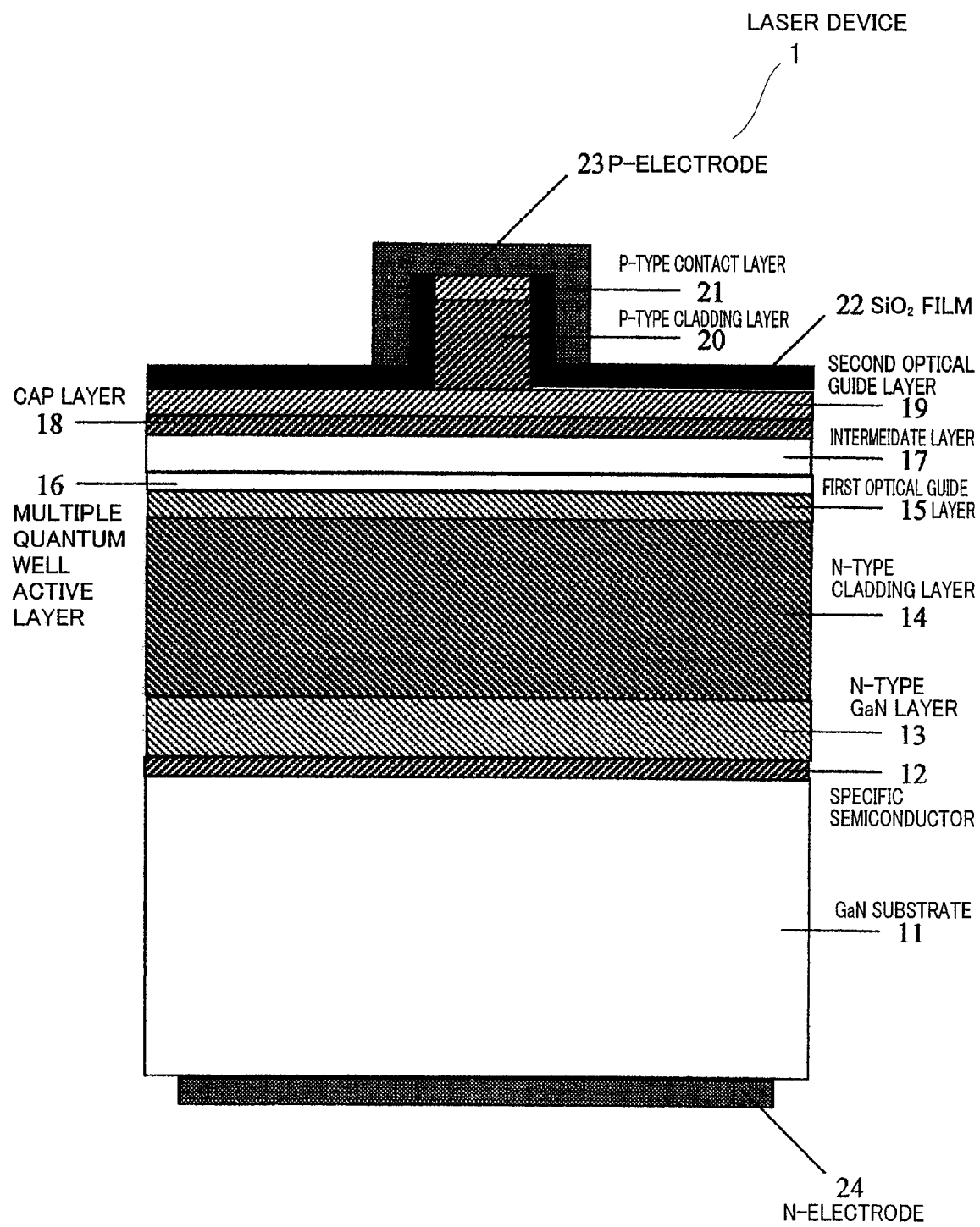
FIG. 1 is a sectional view schematically showing the construction of a laser device according to a first embodiment of the present invention.

Hereinafter, preferred embodiments of the present invention will be described in detail with reference to the drawings. For easy description, each of layers is shown at different magnifications in the drawings as the case may be.

First Embodiment

A nitride semiconductor light-emitting device according to a first embodiment of the present invention is a GaN-based laser device. FIG. 1 is a sectional view schematically showing the construction of the laser device 1 according to the present embodiment. As shown in FIG. 1, the laser device 1 includes a GaN substrate 11 and, as stacked on the substrate 11 in the following order, a specific semiconductor layer 12 comprising GaN doped with Mg, an n-type GaN layer 13, an n-type cladding layer 14 comprising n-type $Al_{0.07}Ga_{0.93}N$, a first optical guide layer 15 comprising n-type GaN, a multiple quantum well active layer 16 comprising $In_{0.10}Ga_{0.90}N/In_{0.02}Ga_{0.98}N$, an intermediate layer 17 comprising $In_{0.02}Ga_{0.98}N$, a cap layer 18 comprising p-type $Al_{0.18}Ga_{0.82}N$, a second optical guide layer 19 comprising p-type GaN, a p-type cladding layer 20 comprising p-type $Al_{0.07}Ga_{0.93}N$, and a p-type contact layer 21 comprising p-type GaN. In a specified region, portions of respective of the p-type cladding layer 20 and p-type contact layer 21 lying above the active layer 16 are removed. The remaining p-type cladding layer 20 and p-type contact layer 21 in the unremoved region form a ridge. A $SiO_2$ film 22 is deposited over the surface of the structure except the top of the ridge. A p-electrode 23 comprising palladium (Pd), platinum (Pt) and gold (Au) is formed over the ridge and the $SiO_2$ film 22, while an n-electrode 24 comprising titanium (Ti), platinum (Pt) and gold (Au) formed on the reverse side of the substrate 11.

Figure 2:
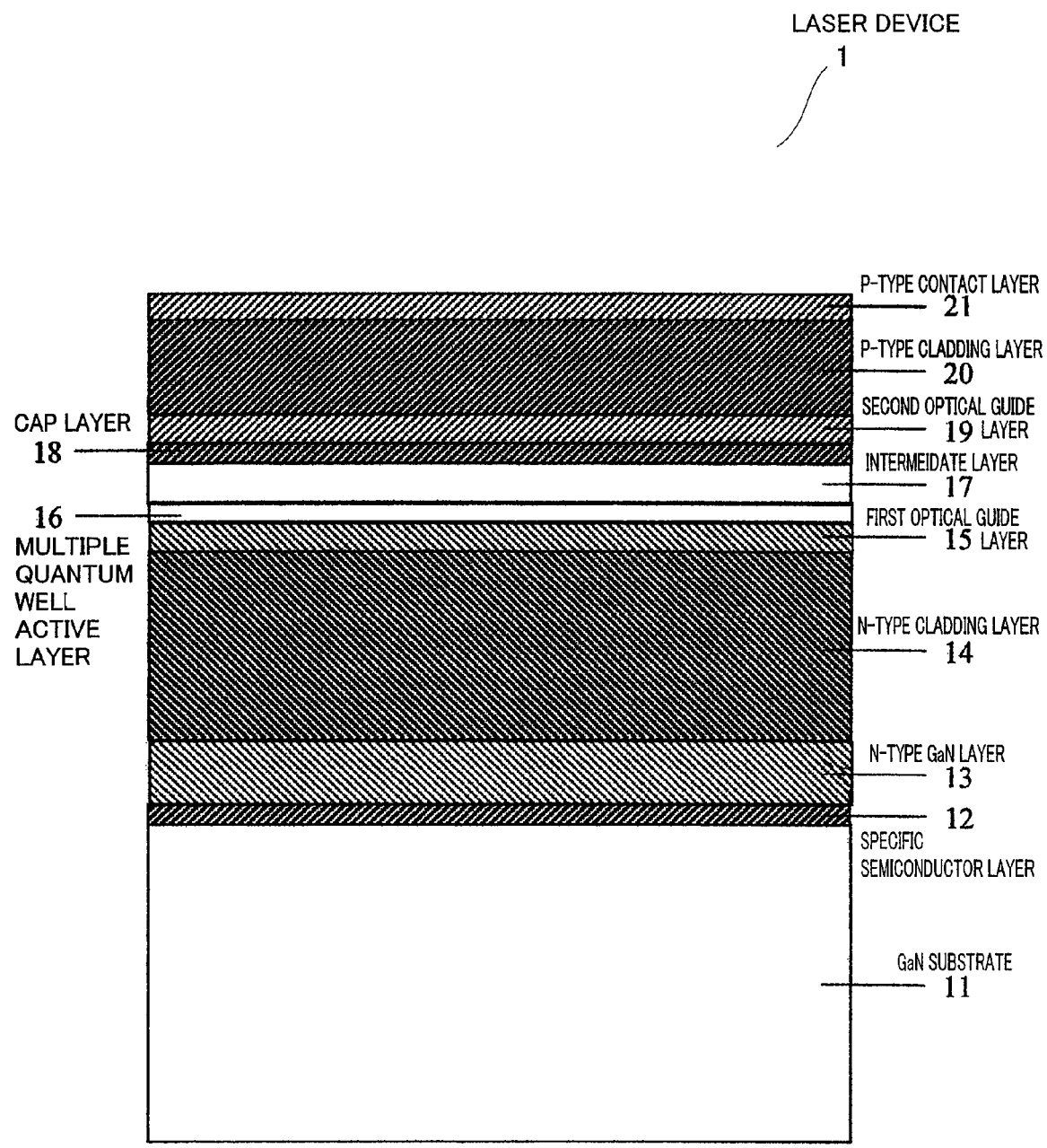
FIG. 2 is a sectional view schematically showing the structure of the laser device according to the first embodiment in a state where the fabrication process has proceeded until completion of the crystal growth process.

The following description is directed to a fabrication method of the laser device 1 according to the present embodiment. FIG. 2 is a sectional view schematically showing the structure of the laser device 1 in a state where the fabrication process has proceeded until completion of the crystal growth process. (Hereinafter, the term "laser device" will be used for a laser structure even in a state before separation into devices.) The crystal growth process will be described with reference to FIG. 2. The GaN substrate 11 having plane (0001) as its main plane is subjected to cleaning with an acid solution. Thereafter, the GaN substrate 11 is held on a susceptor within a reactor of metal organic vapor phase epitaxy (MOVPE) equipment (not shown) and then the reactor is evacuated to vacuum. Subsequently, the reactor is charged with a nitrogen atmosphere to a pressure of 39.9 kPa and then the temperature within the reactor is raised to about 800° C. to heat the GaN substrate 11 for thermal cleaning of the surface of the GaN substrate 11. This thermal cleaning step can remove foreign matter and oxides that remain on the surface of the GaN substrate 11 even after the acid cleaning. This step may use a mixed atmosphere comprising nitrogen and hydrogen produced by addition of hydrogen. However, an excessive hydrogen partial pressure is not preferable because such an excessive hydrogen partial pressure causes an etching reaction to proceed against the surface of the GaN substrate 11 thereby to make rougher the unevenness due to polishing flaw such as scratch while deteriorating the crystallinity by production of Ga droplets.

Subsequently, the temperature of the reactor is raised to about 1000° C., followed by supply of trimethyl gallium (TMG) gas at a feed rate of 7 sccm, ammonium gas ($NH_3$) at a feed rate of 7.5 slm and a carrier gas comprising a mixed gas of nitrogen and hydrogen to the main plane of the GaN substrate 11, along with supply of gas of bicyclopentadienyl magnesium ($Cp_2Mg$) as a p-type impurity dopant thereto.

In the above-described initial stage of the crystal growth process the specific semiconductor layer 12 comprising Mg-doped GaN is formed on the GaN substrate 11. In the present embodiment the feed rate and feed duration Of $Cp_2Mg$ gas are controlled to grow the specific semiconductor layer 12 having a thickness of about 20 nm and a Mg impurity concentration of about $2 \times 10^{17}$ cm$^{-3}$. The specific semiconductor layer 12 comprising p-type GaN will serve to absorb light leaking from the active layer 16 toward the GaN substrate 11 side (stray light) during the laser operation. While the thickness of the GaN specific semiconductor layer 12 is about 20 nm in the present embodiment, there is no particular limitation to this specific layer thickness. The specific semiconductor layer 12 is effective in suppressing stray light leaking out of the GaN substrate 11 and in planarizing unevenness on the surface of the GaN substrate 11 as long as the thickness thereof is about 5 nm or more. Thus, the thickness of the specific semiconductor layer 12 is preferably not less than 5 nm and not more than 200 nm, more preferably not less than 5 nm and not more than 100 nm. If the thickness of the specific semiconductor layer 12 is more than 200 nm, deterioration in crystallinity such as formation of point defects in the crystal and degradation in the flatness of the crystal surface due to the thickened layer become considerable undesirably. Though the specific semiconductor layer 12 consists of a single layer, the specific semiconductor layer 12 may consist of a plurality of such layers formed between the GaN substrate 11 and the active layer 16.

The Mg impurity concentration in the specific semiconductor layer 12 is preferably not less than $1 \times 10^{17}$ cm$^{-3}$ and not more than $2 \times 10^{18}$ cm$^{-3}$. An impurity concentration of more than $2 \times 10^{18}$ cm$^{-3}$ is not preferable because such a high impurity concentration will degrade the flatness of the crystal surface considerably.

In turn, with only the supply of $Cp_2Mg$ gas stopped, silane ($SiH_4$) gas is supplied as an n-type impurity dopant to allow the n-type GaN layer 13 having a thickness of about 0.3 μm and a Si impurity concentration of about $5 \times 10^{17}$ cm$^{-3}$ to grow. Subsequently, trimethyl aluminum (TMA) is also supplied to allow the n-type cladding layer 14 having a thickness of about 1.2 μm and comprising n-type $Al_{0.07}Ga_{0.93}N$ having a Si impurity concentration of about $5\times10^{17}$ cm$^{-3}$ to grow. Subsequently, the first optical guide layer 15 having a thickness of about 120 nm and comprising n-type GaN having a Si impurity concentration of about $5\times10^{17}$ cm$^{-3}$ is grown. Thereafter, with the temperature lowered to about 800° C. and with the carrier gas changed to comprise nitrogen only, trimethyl indium (TMI) and TMG are supplied to allow growth of the multiple quantum well active layer 16 consisting of quantum well layers (three layers) each having a thickness of about 3 nm and comprising $In_{0.10}Ga_{0.90}N$ and barrier layers (two layers) each having a thickness of about 7 nm and comprising $In_{0.02}Ga_{0.98}N$.

Subsequently, the intermediate layer 17 having a thickness of about 100 nm and comprising $In_{0.02}Ga_{0.98}N$ is grown. The intermediate layer 17 is an undoped layer not containing any impurity. The intermediate layer 17 will serve to prevent contamination of the active layer 16 by Mg as a p-type dopant due to diffusion or the like as well as to reduce an optical absorption loss caused by Mg during the laser operation.

Thereafter, with the temperature within the reactor raised to about 1000° C. again and with the carrier gas mixed with hydrogen, $Cp_2Mg$ gas and TMG gas are supplied and then TMA gas also supplied, thereby allowing growth of the cap layer 18 having a thickness of about 20 nm and comprising p-type $Al_{0.18}Ga_{0.82}N$ having a Mg impurity concentration of about $1\times10^{19}$ cm$^{-3}$. In the present embodiment the supply of $Cp_2Mg$ gas is started before the growth of the cap layer 18. A p-type AlGaN layer is known to have increasing resistance with increasing Al content, like the cap layer 18. Further, in some cases where the reactor tube of the MOVPE equipment is formed from quartz, Mg supplied into the reactor tube reacts with quartz, with the result that the resulting semiconductor has an undesired Mg concentration (memory effect.) For this reason, by starting the supply of $Cp_2Mg$ gas before the growth of the cap layer 18 as in the present embodiment, it is possible to lessen Mg doping delay due to the aforementioned memory effect, hence, suppress the increase in the resistance of the cap layer 18. The aforementioned memory effect can be further suppressed by supplying a larger amount of $Cp_2Mg$ gas before the growth of the cap layer 18 than the amount of $Cp_2Mg$ gas to be supplied during the growth of the cap layer 18. The cap layer 18 will serve to prevent evaporation of $1n$ from the active layer 16 during the subsequent growth of the p-type cladding layer 20 as well as overflow of electrons injected from an n-type layer to the active layer 16 during current injection toward a p-type layer.

While the thickness of the cap layer 18 is about 20 nm in the present embodiment, there is no particular limitation to this specific layer thickness. Because the cap layer 18 exhibits a considerable electron-overflow preventive effect until its thickness decreases to about 10 nm, the thickness of the cap layer 18 is preferably not less than 10 nm. While the present embodiment sets the Al content in the cap layer 18 to 18%, there is no limitation to this value of content. Because the electron-overflow preventive effect is considerable until the Al content in the cap layer 18 decreases to about 10%, the Al content in the cap layer 18 is preferably not less than 10%.

In turn, the second optical guide layer 19 comprising p-type GaN having a Mg impurity concentration of about $1\times10^{19}$ cm$^{-3}$ is grown to a thickness of about 100 nm. Subsequently, the p-type cladding layer 20 comprising p-type $Al_{0.07}Ga_{0.93}N$ having a Mg impurity concentration of about $1\times10^{19}$ cm$^{-3}$ is grown to a thickness of about 0.5 µm. Finally, the p-type contact layer 21 comprising p-type GaN having a Mg impurity concentration of about $1\times10^{19}$ cm$^{-3}$ is grown to a thickness of about 60 nm. Here, preferably, the Mg concentration of the p-type contact layer 21 in an uppermost portion having a depth of about 10 nm from the surface is further increased (to about $1\times10^{20}$ cm$^{-3}$ for example.) By so doing, the contact resistance of the contact layer 21 to the p-electrode 23 can be substantially reduced, which will contribute to a decrease in the operating voltage of the laser device 1, hence, to prolongation of the lifetime of the laser device 1.

While the Al content in each of the n-type cladding layer 14 and the p-type cladding layer 20 is set to 7% in the present embodiment, it is possible to reduce the Al content to 3-5%. Such a reduction in the Al content of each cladding layer will make it possible to lower the degree of lattice mismatch between GaN and InGaN, relieve the strain on the active layer 16 and hence further improve the reliability of the laser device.

With reference to the sectional view at FIG. 1 schematically showing the construction of the laser device 1, description will be made of an electrode forming process. After the completion of the crystal growth process, a heat treatment is first performed to activate the p-type semiconductor layer. Heating is conducted in a nitrogen atmosphere at 750° C. for about 10 minutes. Subsequently, an insulating film comprising silicon dioxide ($SiO_2$) is deposited on the crystal surface of the laser, followed by deposition of a resist film on the insulating film. The resist film is then patterned by photolithography to remain only in a ridge forming region (having a ridge width of about 2 µm) of the p-type contact layer 21. Thereafter, a portion of the $SiO_2$ film lying within the resist-removed region is removed with a hydrofluoric acid solution using the resist film as a mask, so that the p-type contact layer 21 becomes exposed within that region. Subsequently, the region other than the ridge forming region is subjected to etching by a dry etching apparatus (not shown) so that the layer to remain above the active layer 16 is controlled to have a thickness of about 0.1 µm. As a result, the portions of respective of the p-type cladding layer 20 and the p-type contact layer 21 lying within the region other than the ridge forming region are removed. In this dry etching process, chlorine gas ($Cl_2$) is used. Thereafter, the resist film remaining on the resulting ridge is removed with an organic solution such as acetone and then the $SiO_2$ film remaining on the ridge is removed with a hydrofluoric acid solution. Subsequently, with a p-electrode 23 forming region on the ridge being masked with a predetermined mask layer, $SiO_2$ film 22 is deposited over the region other than the p-electrode 23 forming region on the ridge, followed by vapor deposition of palladium (Pd), platinum (Pt) and gold (Au) on the ridge and the $SiO_2$ film to form the p-electrode 23.

In turn, the reverse side of the substrate 11 is polished to lessen the total layer thickness to about 100 µm. Onto the thus polished reverse side of the substrate 11 are evaporated titanium (Ti), platinum (Pt) and gold (Au) to form the n-electrode 24. In this case the n-electrode 24 is formed not to cover the entire surface on the reverse side but to be separated into segments corresponding to respective laser devices. By thus separating the electrode into segments, separation of the laser devices from each other by cleavage will be easy.

Subsequently, the fabrication process proceeds to a process of cleavage at edges of each laser resonator. The GaN substrate 11 is cleaved into bar-shaped sections with a cleavage apparatus (not shown) so that each of resonator edges has plane (1-100) of the GaN substrate 11. In the present embodiment the length of each laser resonator is set to 600 µm. The rear edge of each laser resonator is covered with a high reflection coat having a reflectance of about 90% by deposition of a dielectric multi-layered film comprising three pairs of $SiO_2$ layer and titanium dioxide ($TiO_2$) layer on the rear edge by using a sputtering apparatus (not shown.)

Finally, each bar-shaped laser device is separated into laser chips by secondary cleavage and then each of the laser chips is mounted so that its p-electrode 23 side becomes in contact with a laser can.

EXAMPLE 1

The laser device 1 according to the above-described first embodiment was fabricated as example 1, while a laser device 1' of the same construction as the laser device 1 except that the GaN specific semiconductor layer 12 was absent was fabricated as comparative example 1. These laser devices were subjected to the following tests (a) to (d).

Figure 3:
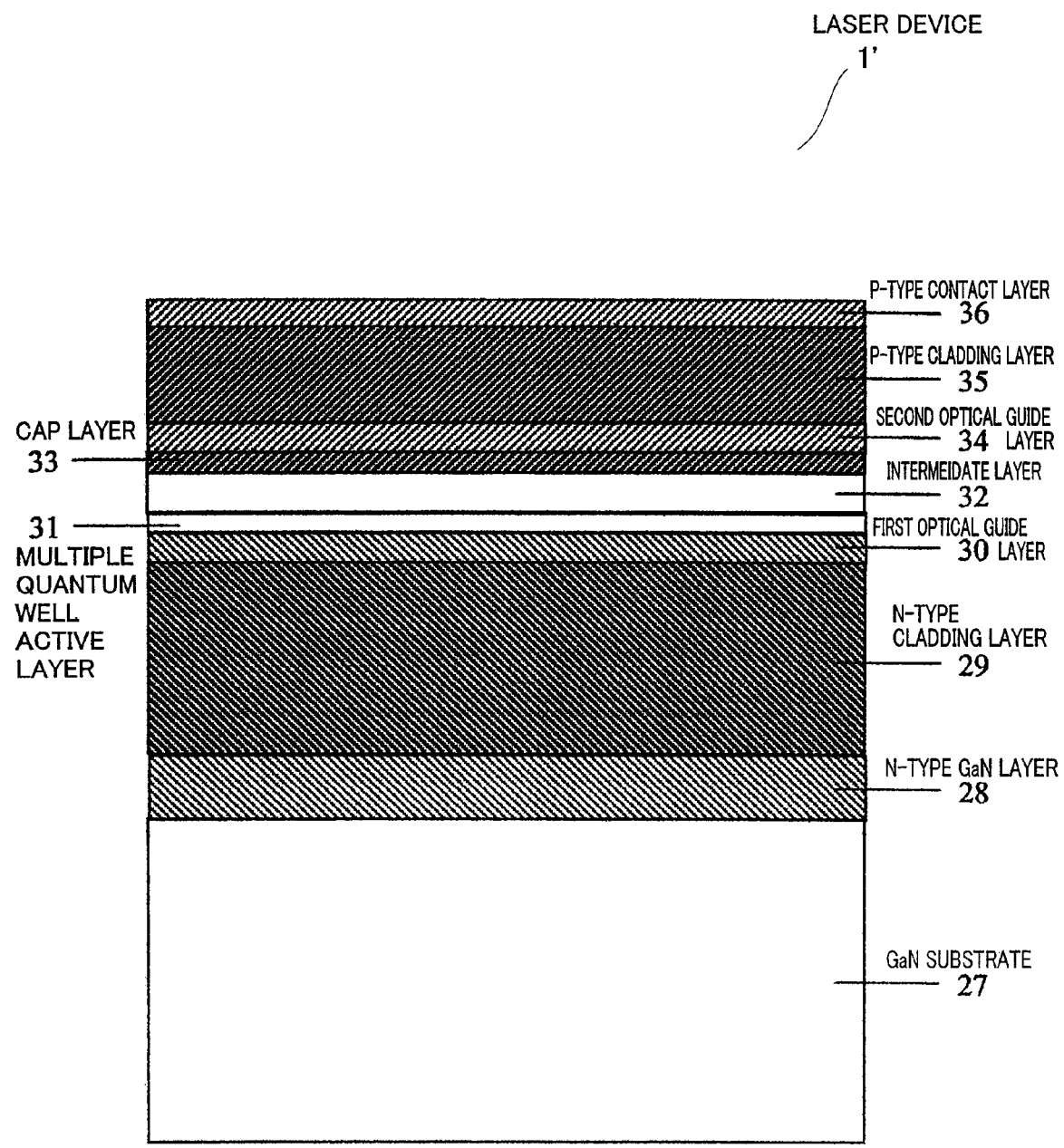
FIG. 3 is a sectional view schematically showing the structure of a laser device as comparative example 1 in a state where the fabrication process has proceeded until completion of the crystal growth process.

FIG. 3 is a sectional view showing the structure of the laser device 1' as comparative example 1 in a state where the fabrication process has proceeded until completion of the crystal growth process. The laser device 1' includes a GaN substrate 27 and, as stacked on the GaN substrate 27 in the following order, an n-type GaN layer 28, an n-type cladding layer 29 comprising n-type $Al_{0.07}Ga_{0.93}N$, a first optical guide layer 30 comprising n-type GaN, a multiple quantum well active layer 31 comprising $In_{0.10}Ga_{0.90}N/In_{0.02}Ga_{0.98}N$, an intermediate layer 32 comprising $In_{0.02}Ga_{0.98}N$, a cap layer 33 comprising $Al_{0.18}Ga_{0.82}N$, a second optical guide layer 34 comprising p-type GaN, a p-type cladding layer 35 comprising p-type $Al_{0.07}Ga_{0.93}N$, and a p-type contact layer 36 comprising p-type GaN. Since the crystal growth method employed in the fabrication of the laser device 1' is the same as that employed for the laser device 1 according to the first embodiment except that the method does not include the crystal growth process of growing the GaN specific semiconductor layer 12, description thereof will be omitted. Further, the process steps performed after the crystal growth, including the steps of forming the $SiO_2$ insulating film and the electrodes and the cleavage process, are the same as in the first embodiment and, hence, the illustration and description thereof will be omitted.

(a) Observation of a Section of a Stack of Crystal Layers with a Transmission Electron Microscope A section of a stack of crystal layers in each of the laser devices as respective of example 1 and comparative example 1 was observed with a transmission electron microscope after the crystal growth process of the fabrication process has been completed. (The observed section is not shown.)

With respect to example 1, the GaN substrate 11 was observed to have unevenness on its surface due to polishing flaw such as scratch, whereas the specific semiconductor layer 12 observed to have substantially reduced unevenness on its surface. Specifically, the surface of the GaN substrate 11 had an uneven portion having a height of about 10 nm (from peak to valley), whereas the height of an uneven portion of the surface of the specific semiconductor layer 12 stacked on the substrate 11 was reduced to about 2 nm.

With respect to comparative example 1, on the other hand, the GaN substrate 27 was observed to have unevenness on its surface due to polishing flaw such as scratch and positional fluctuation of each layer (hereinafter will be referred to as "layer thickness fluctuation" as the case may be) due to this unevenness was observed to propagate throughout the entire laser structure including the active layer 31. Specifically, the layer thickness fluctuation of the active layer 31 was as large as about 3 nm, which was comparable to the quantum well layer thickness (about 3 nm) of the active layer 31. That is, the active layer 31 had a layer thickness fluctuation substantially as large as the quantum well layer thickness, which means that such a large layer thickness fluctuation will cause degraded light-emitting characteristic of the laser characteristics, nonuniform laser characteristics in the plane of the GaN substrate and decreased fabrication yield.

According to the consideration given by the inventor of the present invention to the reason why the specific semiconductor layer 12 of example 1 had substantially reduced unevenness on its surface, it is estimated that doping with Mg during the growth of GaN crystal on the GaN substrate facilitated lateral growth parallel with the GaN substrate with the result that the unevenness on the surface of the GaN substrate 11 was planarized during the initial stage of the growth process. Such planarization of the crystal surface results in planarization of the quantum well layer of the active layer 16, which will enhance the quantum effect considerably, thus contributing to improvements in the laser characteristics such as lowering of the threshold current.

(b) Measurement of Laser Characteristics

The current-optical output characteristic of each of example 1 and comparative example 1 was measured under injection of current to each laser device.

Figure 4:
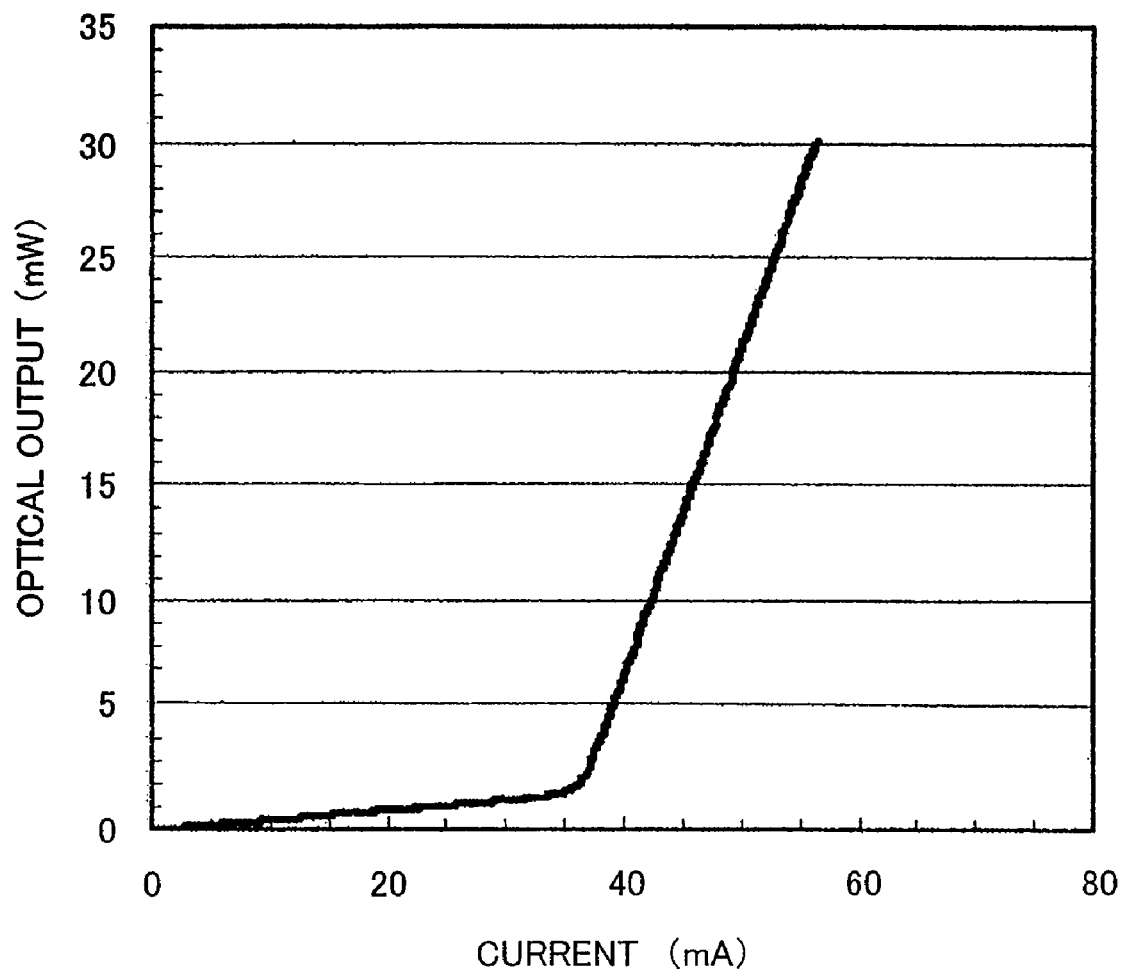
FIG. 4 is a chart plotting the current-optical output characteristic of a laser device as example 1.

FIG. 4 is a chart plotting the current-optical output characteristic of the laser device 1 as example 1. As can be seen from FIG. 1, the laser device 1 reached continuous wave oscillation at room temperature under current injection. At that time, mean values of respective of threshold current and slope efficiency were 35 mA and 1.4 W/A, respectively.

The laser device 1' as comparative example 1 reached continuous wave oscillation at room temperature under current injection. At that time, mean values of respective of threshold current and slope efficiency were 55 mA and 0.8 W/A, respectively. As understood from the comparison with the laser device 1, the laser device 1' exhibited degraded threshold current and degraded slope efficiency. Conceivably, this is because each layer of the laser device 1' had layer thickness fluctuation caused by unevenness on the surface of the GaN substrate 27. Devices that were comparable in laser characteristics to the laser device 1 were obtainable from one whole GaN substrate 27 in a yield as low as about 30% according to the fabrication process of laser device 1'.

(c) Measurement of Relative Intensity Noise

The relative intensity noise (RIN) of each of the laser devices as example 1 and comparative example 1 varying with varying optical output (1 to 10 mW) was measured.

Figure 5:
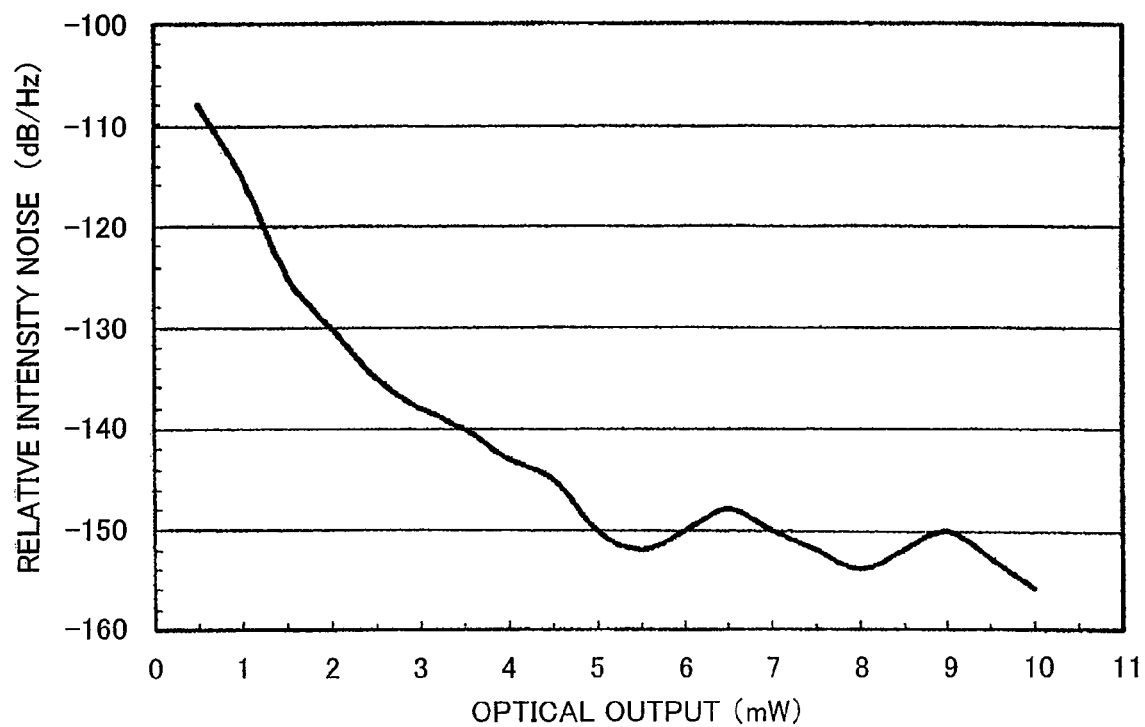
FIG. 5 is a chart plotting the optical output-RIN characteristic of the laser device as example 1.
Figure 6:
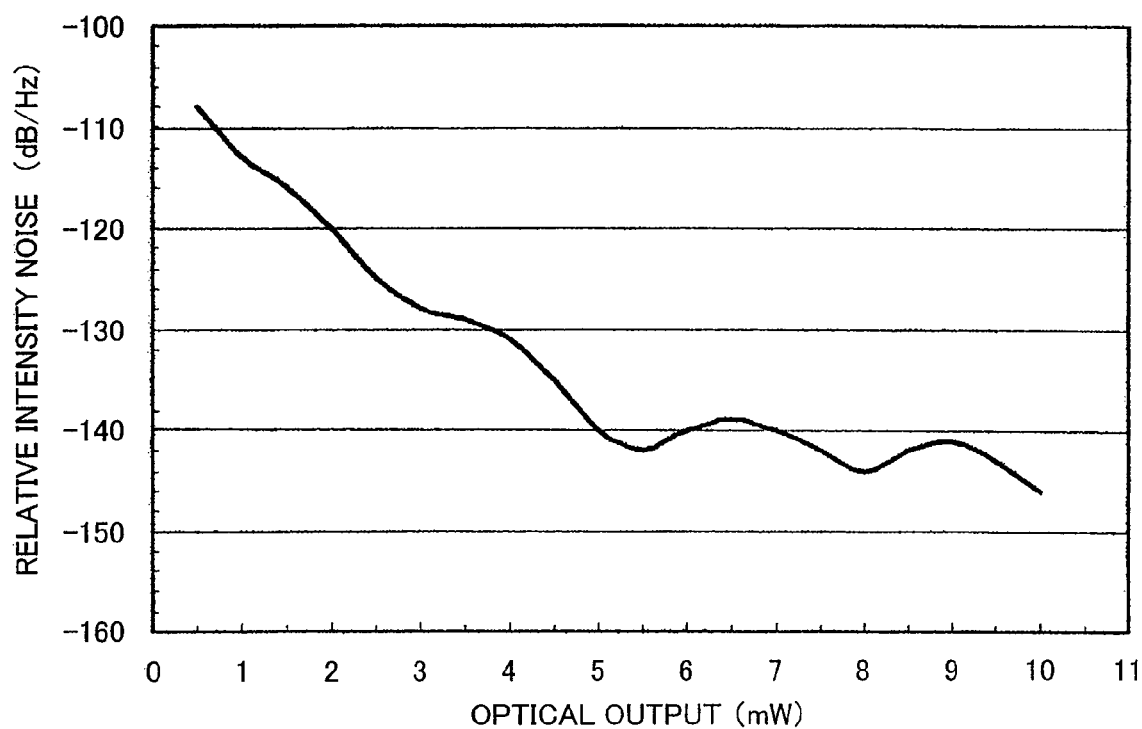
FIG. 6 is a chart plotting the optical output-RIN characteristic of the laser device as comparative example 1.

FIG. 5 is a chart plotting the optical output-relative intensity noise (RIN) characteristic of the laser device 1 and FIG. 6 is a chart plotting the optical output-RIN characteristic of the laser device 1'. Note that for the purpose of reducing noise caused by optical feedback which occurred upon irradiation of an optical disk with laser light, a high-frequency of about 400 MHz was superimposed on the bias (current) applied to each laser device during the RIN measurement. As apparent from FIG. 5, generally, RIN increases with decreasing optical output because of increasing influence of spontaneous emission light. Practically, the Blue-ray Disc requires an output of laser light as low as about 2.5 mW for reproduction. In this case it is requested that RIN be not more than −130 dB/Hz. Actually, the laser device 1 exhibited RIN of about −135 dB/Hz meeting the aforementioned request when the optical output was 2.5 mW (see FIG. 5). On the other hand, the laser device 1' exhibited RIN of about −125 dB/Hz when the optical output was 2.5 mW (see FIG. 6.)

The laser device 1 achieved such a noise reduction as compared with the laser device 1' because, it is estimated, the GaN specific semiconductor layer 12 absorbed spontaneous emission light (stray light) leaking from the active layer 16 toward the GaN substrate 11 side. In contrast, the laser device 1' produced increased noise because, it is estimated, spontaneous emission light (stray light) leaked out of the GaN substrate 27 to increase quantum noise because of the absence of the p-type GAN specific semiconductor layer.

(d) Constant Optical Output Life Test

Samples of laser device 1, each of which exhibited a power consumption (the product of operating current by operating voltage) of about 0.4 W when the optical output was 50 mW, were selected. These samples were subjected to a constant optical output (APC) life test under the conditions: a constant optical output as high as 50 mW and a temperature as high as 60° C. As a result, the samples of laser device 1 exhibited a deterioration rate (operating current increasing rate) of about 0.001 mA per hour and were confirmed to operate stably for not less than 3,000 hours.

In the same manner as above, samples of laser device 1', each of which exhibited a power consumption substantially equal to the aforementioned power consumption (0.4 W) when the optical output was 50 mW, were selected. These samples were subjected to the APC life test at an optical output as high as 50 mW. The laser devices exhibiting substantially equal power consumption were selected as the samples of example 1 and comparative example 1 because the correlation between the internal stress and the lifetime cannot be clearly determined unless the laser devices exhibiting substantially equal power consumption are compared with each other since the lifetime of a GaN-based laser depends greatly upon the power consumption.

The deterioration rate of the laser device 1' as comparative example 1 was about 20 times as high as that of the laser device 1 as example 1. As can be understood from this fact, the laser device 1' deteriorates rapidly.

This is because, it is estimated, the absence of the GaN specific semiconductor layer allowed the layer thickness fluctuation to occur at each of the layers including the active layer 31 with the result that minute crystal strain (lattice strain) was applied on the active layer, which led to accelerated deterioration.

(e) Test for Estimating Optical Absorption at the Specific Semiconductor Layer

Figure 7:
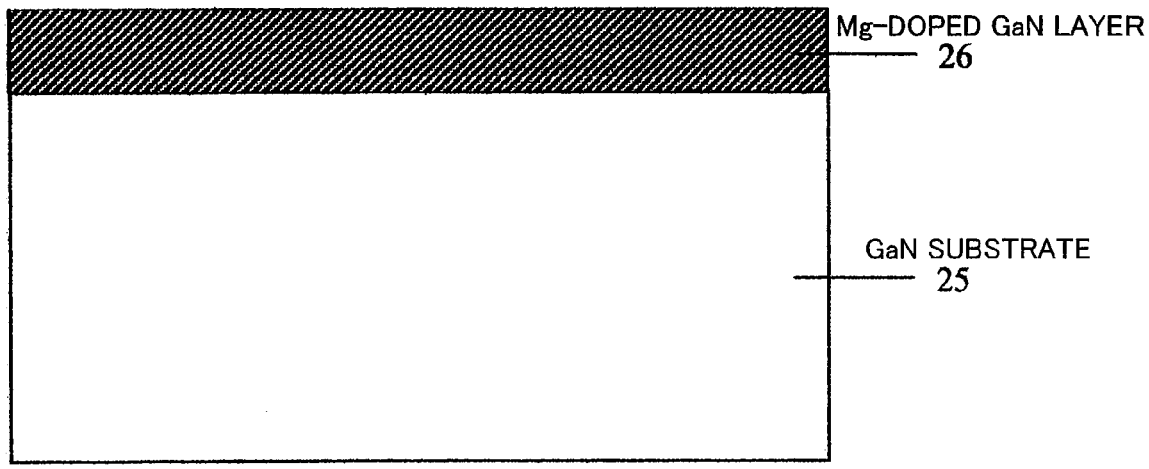
FIG. 7 is a sectional view showing the structure of sample 1.

A test for estimating optical absorption at the specific semiconductor layer was conducted. Samples 1 and 2 were prepared for the test. FIG. 7 is a sectional view showing the structure of sample 1. Sample 1 had a Mg-doped GaN layer 26 having a Mg impurity concentration (about $2 \times 10^{17}$ cm$^{-3}$) equal to that of the GaN specific semiconductor layer 12. The Mg-doped GaN layer 26 was grown on GaN substrate 25 according to the same crystal growth method as in the first embodiment. While the GaN specific semiconductor layer 12 has a thickness of about 20 nm in the first embodiment, the Mg-doped GaN layer 26 was intentionally formed thicker in the test for quantitative estimation of the amount of optical absorption; specifically, the thickness of the Mg-doped GaN layer 26 was about 500 nm. Sample 2 (not shown) had a Mg-undoped GaN layer grown to a thickness of about 500 nm on a GaN substrate.

Figure 8:
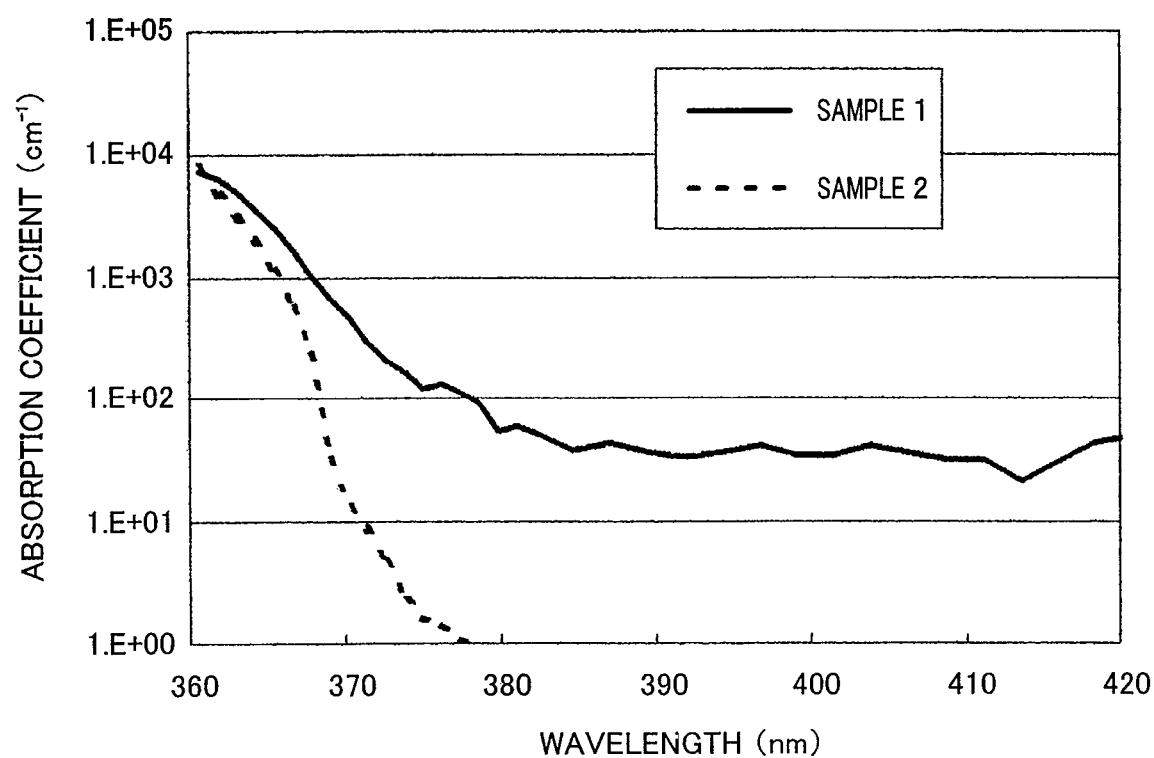
FIG. 8 is a chart plotting the absorption spectra of samples 1 and 2.

The absorption spectra of respective samples 1 and 2 were measured. The measurement was conducted using a xenon (Xe) lamp at an angle such as to suppress optical interference (Brewster angle). FIG. 8 plots the absorption spectra of respective samples 1 and 2 as the results of the measurement. As can be seen from FIG. 8, the absorption coefficients of the respective samples 1 and 2 were about 40 cm$^{-1}$ and about 1 cm$^{-1}$, respectively, when the oscillation frequency was 405 nm, which is the oscillation frequency of laser device 1 according to the first embodiment. It can be said from these results that the provision of the Mg-doped GaN layer 26 (corresponding to the specific semiconductor layer 12) in sample 1 made it possible to absorb laser light to a very large extent. Thus, the laser device 1 provided with the specific semiconductor layer 12 according to the first embodiment was confirmed to have a sufficient effect in absorbing and suppressing light leaking from the active layer 16 toward the GaN substrate 11 side.

It is estimated that the laser light absorption effect of sample 1 was attributable to formation of a deep acceptor level within the bandgap of GaN by Mg contained in the GaN layer 26.

The above-described results of the tests have revealed that a layer doped with a p-type impurity formed first on a GaN substrate by crystal growth in a GaN-based laser on the GaN substrate provides improvements in:

(1) reducing noise of the laser due to light leaking from the active layer toward the GaN substrate side (stray light); and (2) preventing degradation in the laser characteristics and decrease in yield due to unevenness of the surface of the GaN substrate.

Second Embodiment

Figure 9:
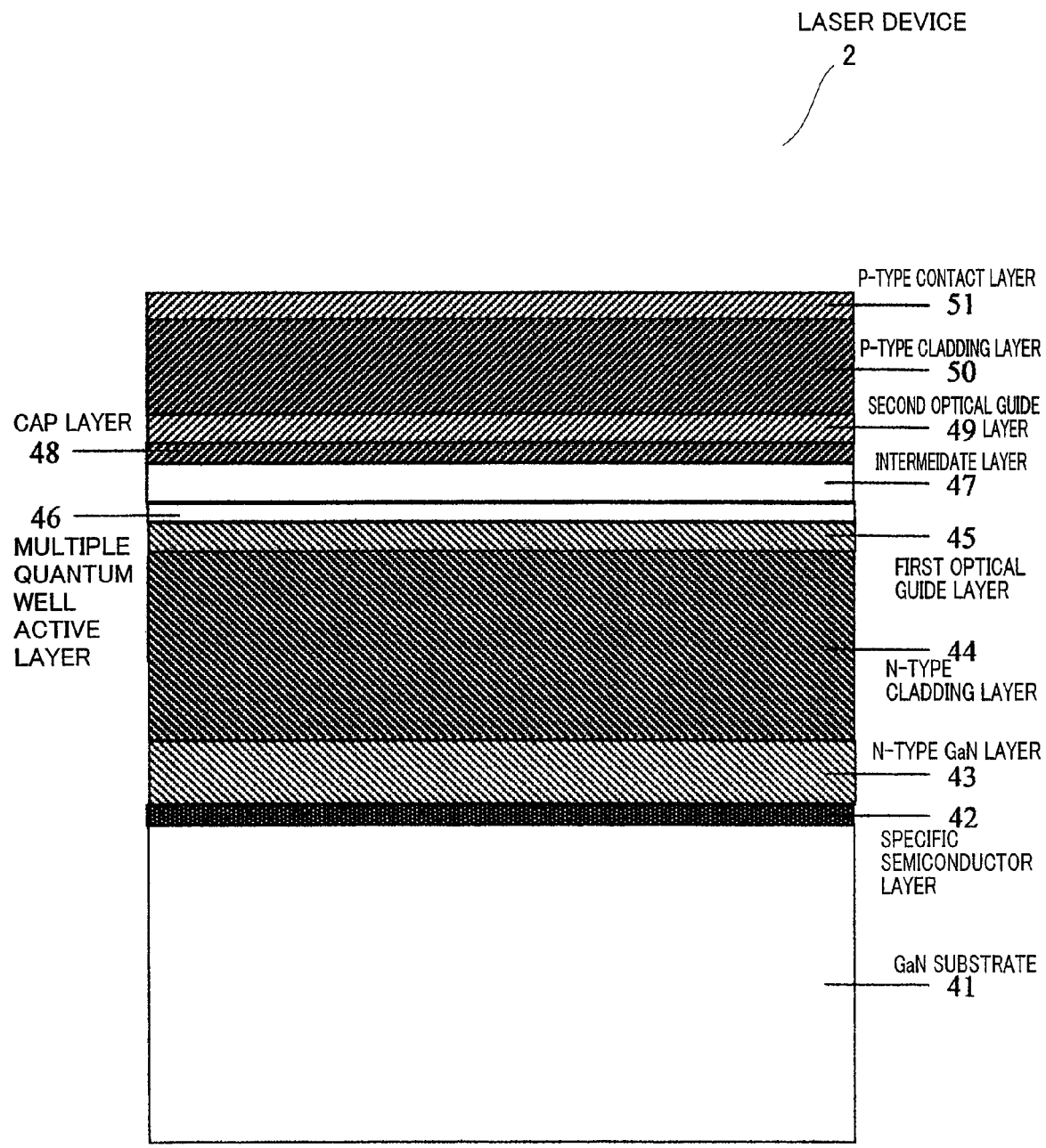
FIG. 9 is a sectional view schematically showing the structure of a laser device according to a second embodiment in a state where the fabrication process has proceeded until completion of the crystal growth process.

A nitride semiconductor light-emitting device according to a second embodiment of the present invention is a GaN-based laser device. FIG. 9 is a sectional view schematically showing the structure of the laser device 2 according to the second embodiment in a state where the fabrication process has proceeded until completion of the crystal growth process. The laser device 2 has the same construction as the laser device 1 of the first embodiment except the composition of the specific semiconductor layer. As shown in FIG. 9, the laser device 2 includes a GaN substrate 41 and, as stacked on the substrate 41 in the following order, a specific semiconductor layer 42 comprising GaN doped with Mg and Si, an n-type GaN layer 43, an n-type cladding layer 44 comprising n-type $Al_{0.07}Ga_{0.93}N$, a first optical guide layer 45 comprising n-type GaN, a multiple quantum well active layer 46 comprising $In_{0.10}Ga_{0.90}N/In_{0.02}Ga_{0.98}N$, an intermediate layer 47 comprising $In_{0.02}Ga_{0.98}N$, a cap layer 48 comprising p-type $Al_{0.18}Ga_{0.82}N$, a second optical guide layer 49 comprising p-type GaN, a p-type cladding layer 50 comprising p-type $Al_{0.07}Ga_{0.93}N$, and a p-type contact layer 51 comprising p-type GaN.

Since the crystal growth method employed for the fabrication of the laser device 2 is the same as that employed for the laser device 1 of the first embodiment except the crystal growth process of growing the GaN specific semiconductor layer, description thereof will be made only of the crystal growth process of growing the GaN specific semiconductor layer 42. Further, the process steps performed after the crystal growth, including the steps of forming the SiO$_2$ insulating film and the electrodes and the cleavage process, are the same as in the first embodiment and, hence, the illustration and description thereof will be omitted.

After acid cleaning, the GaN substrate 41 having plane (0001) as its main plane is put into the reactor of the MOVPE equipment and then the temperature of the reactor is raised to about 800° C. to heat the GaN substrate 41 for thermal cleaning of the surface of the GaN substrate 41. Subsequently, the temperature of the reactor is raised to about 1000° C., followed by supply of TMG gas, NH$_3$ gas and a carrier gas comprising a mixed gas of nitrogen and hydrogen to the main plane of the GaN substrate 41, along with supply of Cp$_2$Mg gas and SiH$_4$ gas thereto. In the above-described initial stage of the crystal growth process the GaN specific semiconductor layer 42 is formed on the GaN substrate 41. In the present embodiment the feed rates and feed durations of respective of $Cp_2Mg$ gas and $SiH_4$ gas are controlled to allow growth of the GaN specific semiconductor layer 42 having a thickness of about 20 nm, a Mg impurity concentration of about $2\times10^{17}$ $cm^{-3}$ and a Si impurity concentration of about $1\times10^{18}$ $cm^{-3}$. The GaN specific semiconductor layer 42 will serve to absorb light leaking from the active layer 46 toward the GaN substrate 41 side (stray light) during the laser operation.

While the thickness of the GaN specific semiconductor layer 42 is about 20 nm in the present embodiment, there is no particular limitation to this specific layer thickness. The specific semiconductor layer 42 is effective in suppressing stray light leaking out of the GaN substrate and in planarizing unevenness on the surface of the GaN substrate as long as the thickness thereof is about 5 nm or more. Thus, the thickness of the specific semiconductor layer 42 is preferably not less than 5 nm and not more than 200 nm, more preferably not less than 5 nm and not more than 100 nm. If the thickness of the specific semiconductor layer 42 is more than 200 nm, deterioration in crystallinity such as formation of point defects in the crystal and degradation in the flatness of the crystal surface due to the thickened layer will result undesirably. The Mg impurity concentration in the specific semiconductor layer 42 is preferably not less than $1\times10^{17}$ $cm^{-3}$ and not more than $1\times10^{18}$ $cm^{-3}$. A Mg impurity concentration of more than $1\times10^{18}$ $cm^{-3}$ is not preferable because such a high impurity concentration will degrade the flatness of the crystal surface considerably. The Si impurity concentration in the specific semiconductor layer 42 is preferably not less than $2\times10^{17}$ $cm^{-3}$ and not more than $5\times10^{18}$ $cm^{-3}$. A Si impurity concentration of more than $5\times10^{18}$ $cm^{-3}$ is not preferable because such a high impurity concentration will degrade the flatness of the crystal surface considerably.

While the GaN specific semiconductor layer 42 is formed directly on the GaN substrate 41 in the present embodiment, the GaN specific semiconductor layer 42 may be formed between the GaN substrate 41 and the active layer 46 or between the GaN substrate 41 and the n-type cladding layer 44. Even such an arrangement will exercise an effect to substantially the same extent as the former arrangement in suppressing stray light leaking out of the GaN substrate 41 and in planarizing unevenness of the surface of the GaN substrate 41. In the light of planarization of the surface of the GaN substrate 41 only, however, the specific semiconductor layer 42 is preferably positioned close to the substrate 41. Though the specific semiconductor layer 42 consists of a single layer in the present embodiment, the specific semiconductor layer 42 may consist of a plurality of such layers formed between the GaN substrate 41 and the active layer 46.

While the Al content in each of the n-type cladding layer 44 and the p-type cladding layer 50 is set to 7% in the present embodiment, it is possible to reduce the Al content to 3-5%. Such a reduction in the Al content of each cladding layer will make it possible to lower the degree of lattice mismatch between GaN and InGaN, relieve the strain on the active layer 16 and hence further improve the reliability of the laser device.

EXAMPLE 2

The laser device 2 according to the above-described second embodiment was fabricated as example 2 and subjected to the following tests (a) to (e). The laser device 1 as example 1 was also subjected to the tests.

(a) Measurement of Concentration Distributions of Mg and Si

Figure 10:
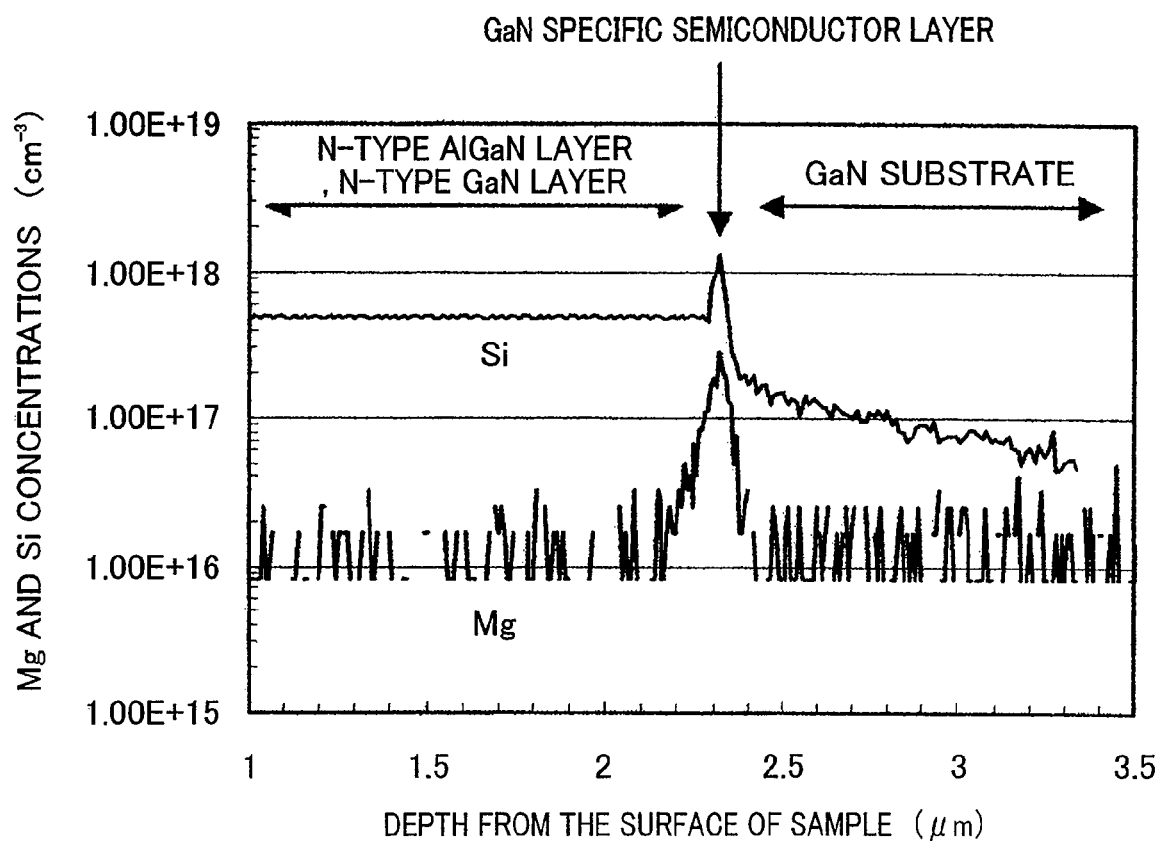
FIG. 10 is a chart plotting the Mg concentration and Si concentration relative to the depth from the surface of the laser device according to the second embodiment.

Concentration distributions of respective of Mg and Si in the vicinity of the GaN specific semiconductor layer 42 of the laser device 2 were measured by secondary ion mass spectroscopy (SIMS). FIG. 10 shows the results of the measurement. FIG. 10 is a chart plotting the Mg concentration and Si concentration relative to the depth from the surface of the laser device 2 (sample). As can be seen from FIG. 10, the Mg concentration peak and Si concentration peak in the GaN specific semiconductor layer 42 were about $2\times10^{17}$ $cm^{-3}$ and about $1\times10^{18}$ $cm^{-3}$, respectively. It can be confirmed from this fact that the GaN specific semiconductor layer 42 was doped with Mg and Si at the same time. According to the result of SIMS analysis on the laser device 1 as example 1, the laser device 1 had a Mg concentration distribution similar to that shown in FIG. 10.

(b) Measurement of Laser Characteristics

The current-optical output characteristic of the laser device 2 was measured under injection of current to the laser device 2. The laser device 2 reached continuous wave oscillation at room temperature under current injection. At that time, a mean value of threshold current and a mean value of slope efficiency were 35 mA and 1.4 W/A, respectively, as with the laser device 1.

(c) Measurement of Operating Voltage

Comparison as to operating voltage was made between the laser device 2 and the laser device 1. The operating voltage of the laser device 1 and that of the laser device 2 were 4.8 V and 4.5 V, respectively, at a current of 50 mA.

Any one of the laser devices 1 and 2 has an n-electrode formed on the polished surface of its GaN substrate. Accordingly, electrons injected to the active layer from the n-electrode side have to pass through the specific semiconductor layer on the way. Since the laser device 2 is doped with Mg (p-type impurity) as well as Si (n-type impurity) at the same time unlike the laser device 1, the laser device 2 has a structure permitting easier conduction of electrons than the laser device 1. For this reason the operating voltage of the laser device 2 was lower than that of the laser device 1.

(d) Measurement of Relative Intensity Noise

The relative intensity noise (RIN) of the laser device 2 varying with varying optical output (1 to 10 mW) was evaluated. Note that for the purpose of reducing noise caused by optical feedback which occurred upon irradiation of an optical disk with laser light, a high-frequency of about 400 MHz was superimposed on the bias (current) applied to the laser device 2 during the RIN measurement. The laser device 2 exhibited RIN of about −135 dB/Hz when the optical output was 2.5 mW.

The laser device 2 can be said to have realized a noise reduction as compared with the laser device 1' as comparative example 1 (see the results of test (c) in the first embodiment.) It is estimated that such a noise reduction was achieved by virtue of considerable absorption of spontaneous emission light (stray light) leaking from the active layer 16 toward the GaN substrate 11 side by the GaN specific semiconductor layer 42.

(e) Constant Optical Output Life Test

Samples of laser device 2, each of which exhibited a power consumption (the product of operating current by operating voltage) of about 0.4 W when the optical output was 50 mW, were selected. These samples were subjected to a constant optical output (APC) life test under the conditions: a constant optical output as high as 50 mW and a temperature as high as 60° C. As a result, the samples of laser device 2 exhibited a deterioration rate (operating current increasing rate) of about 0.001 mA per hour and were confirmed to operate stably for not less than 3,000 hours. Like laser device 1, such long-life devices were obtainable from one GaN substrate 41 in a yield of about 70%.

Conceivably, the prolonged lifetime and increased yield of laser device 2 were attributable to the introduction of the GaN specific semiconductor layer 42. That is, it is estimated that as in laser device 1 of example 1, the introduction of the GaN specific semiconductor layer 42 made it possible to substantially improve the flatness of the GaN substrate surface (by virtue of the planarizing effect produced by Mg-doping) and hence solve the problems of degraded laser characteristics and lowered yield.

(f) Test for Estimating Optical Absorption at the Specific Semiconductor Layer

A test for estimating optical absorption at the specific semiconductor layer was conducted. Samples 1 and 2 as used in the test (e) of the first embodiment and additional sample 3 were prepared for the test. Sample 3 had a GaN layer having a Mg impurity concentration (about $2 \times 10^{17}$ cm$^{-3}$) and a Si impurity concentration (about $1 \times 10^{18}$ cm$^{-3}$) that were equal to respective impurity concentrations of the GaN specific semiconductor layer 42. The Mg- and Si-doped GaN layer was grown on GaN substrate 41 according to the same crystal growth method as in the second embodiment. While the GaN specific semiconductor layer 42 has a thickness of about 20 nm in the second embodiment, the GaN layer grown in sample 3 was intentionally formed thicker in the test for quantitative estimation of the amount of optical absorption; specifically, the thickness of the GaN layer was about 500 nm.

Figure 11:
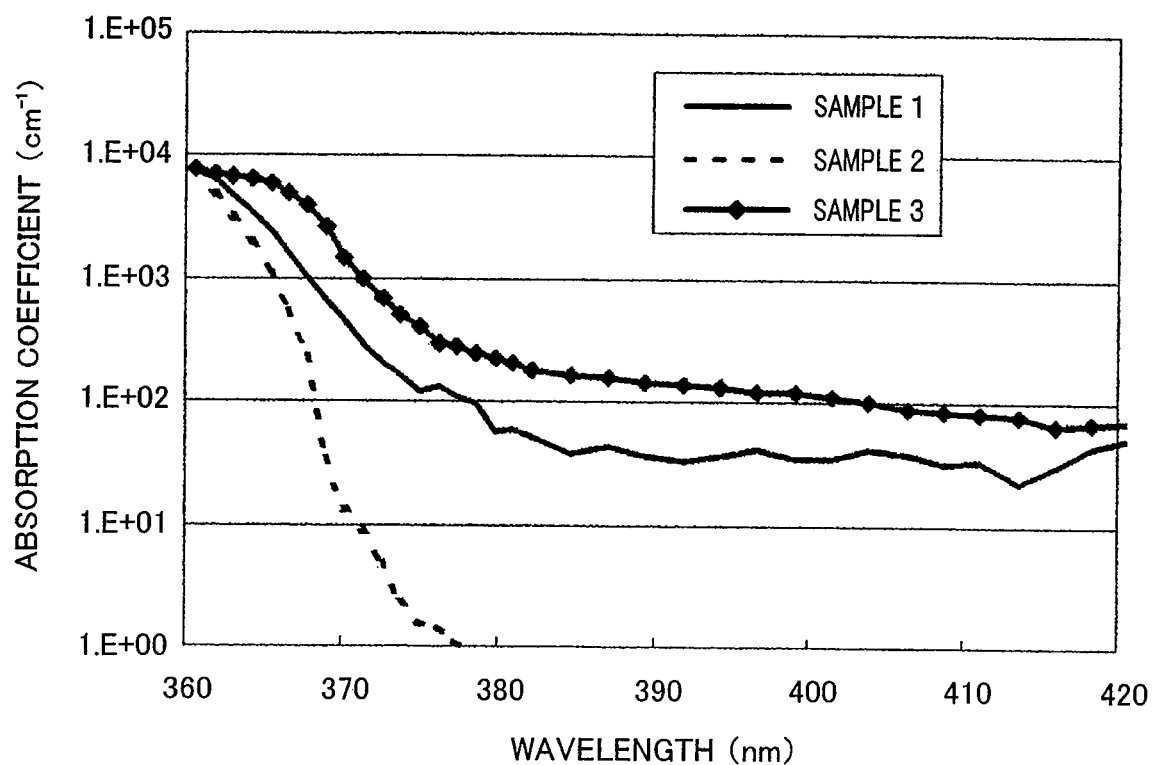
FIG. 11 is a chart plotting the absorption spectra of samples 1 to 3.

The absorption spectra of respective samples 1 to 3 were measured. The measurement was conducted using a xenon (Xe) lamp at an angle such as to suppress optical interference (Brewster angle). FIG. 11 plots the absorption spectra of respective samples 1 to 3 as the results of the measurement. As can be seen from FIG. 11, the absorption coefficient of the sample 3 was about 100 cm$^{-1}$ when the oscillation frequency was 405 nm, which is the oscillation frequency of laser device 2 according to the second embodiment. On the other hand, the absorption coefficients of the respective samples 1 and 2 were not more than about 40 cm$^{-1}$ and not more than about 1 cm$^{-1}$, respectively.

The sample 3 having the GaN specific semiconductor layer doped with the p-type impurity and the n-type impurity at the same time absorbed laser light to a very large extent and was confirmed to have a sufficient effect in absorbing and suppressing laser light leaking from the active layer toward the GaN substrate side. Thus, laser device 2 according to the second embodiment was confirmed to have a sufficient effect in absorbing and suppressing light leaking from the active layer 46 toward the GaN substrate 41 side by virtue of the provision of the specific semiconductor layer 42.

It is estimated that the laser light absorption effect of sample 3 was attributable to simultaneous formation of an acceptor level and a donor level within the bandgap of GaN by Mg and Si doped in the GaN layer.

Third Embodiment

Figure 12:
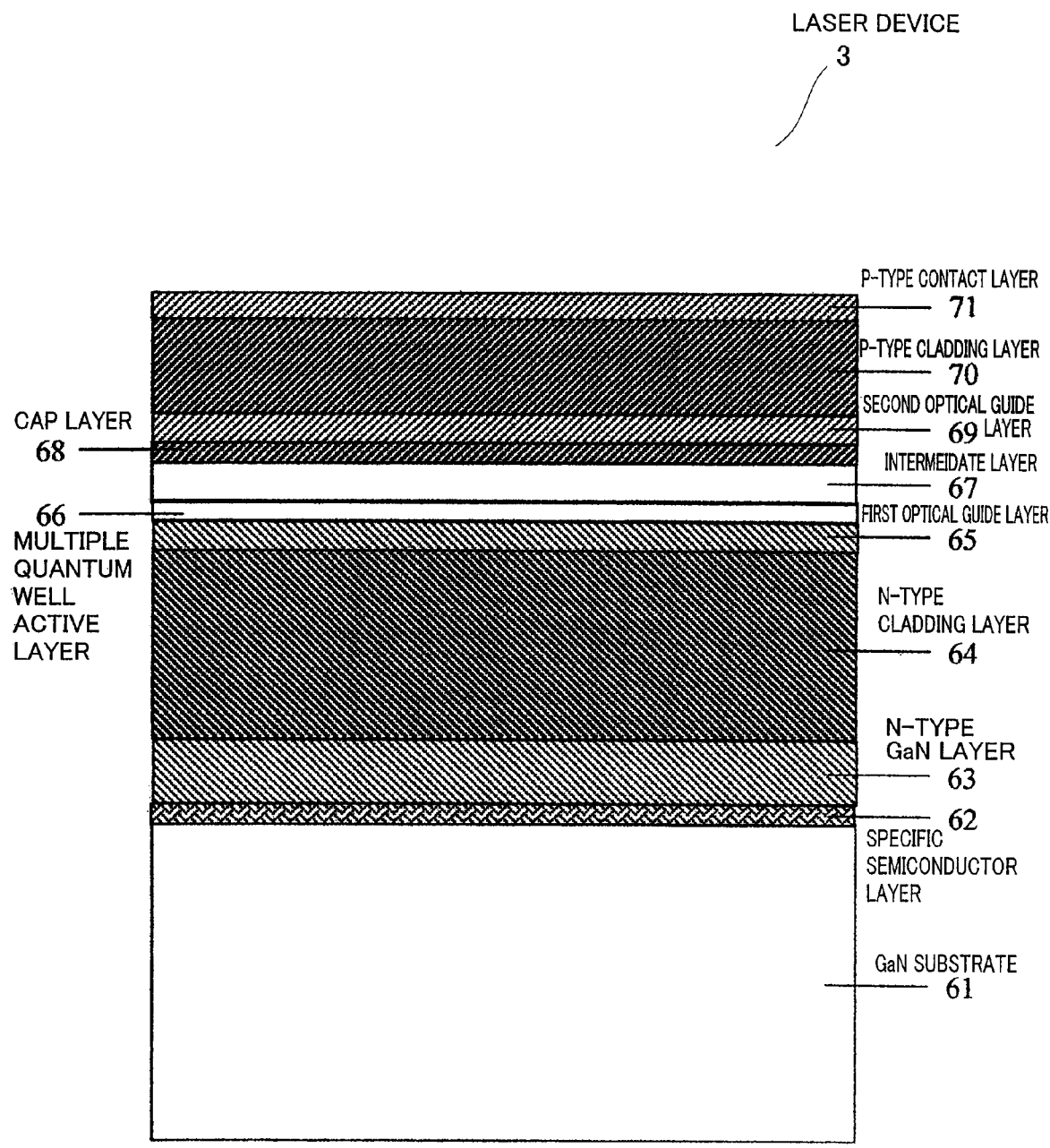
FIG. 12 is a sectional view schematically showing the structure of a laser device step according to a third embodiment in a state where the fabrication process has proceeded until completion of the crystal growth.

A nitride semiconductor light-emitting device according to a third embodiment of the present invention is a GaN-based laser device. FIG. 12 is a sectional view showing the structure of the laser device 3 according to the present embodiment in a state where the fabrication process has proceeded until completion of the crystal growth process. The laser device 3 has the same construction as the laser device 1 of the first embodiment except the composition of the specific semiconductor layer. As shown in FIG. 12, the laser device 3 includes a GaN substrate 61 and, as stacked on the substrate 61 in the following order, a specific semiconductor layer 62 comprising GaN doped with Mg and C, an n-type GaN layer 63, an n-type cladding layer 64 comprising n-type $Al_{0.07}Ga_{0.93}N$, a first optical guide layer 65 comprising n-type GaN, a multiple quantum well active layer 66 comprising $In_{0.10}Ga_{0.90}N$/$In_{0.02}Ga_{0.98}N$, an intermediate layer 67 comprising $In_{0.02}Ga_{0.98}N$, a cap layer 68 comprising p-type $Al_{0.18}Ga_{0.82}N$, a second optical guide layer 69 comprising p-type GaN, a p-type cladding layer 70 comprising p-type $Al_{0.07}Ga_{0.93}N$, and a p-type contact layer 71 comprising p-type GaN.

Since the crystal growth method employed for the fabrication of the laser device 3 is the same as that employed for the laser device 1 of the first embodiment except the crystal growth process of growing the GaN specific semiconductor layer, description thereof will be made only of the crystal growth process of growing the GaN specific semiconductor layer 62. Further, the process steps performed after the crystal growth, including the steps of forming the $SiO_2$ insulating film and the electrodes and the cleavage process, are the same as in the first embodiment and, hence, the illustration and description thereof will be omitted.

After acid cleaning, the GaN substrate 61 having plane (0001) as its main plane is put into the reactor of the MOVPE equipment and then the temperature of the reactor is raised to about 800° C. to heat the GaN substrate 61 for thermal cleaning of the surface of the GaN substrate 61. Subsequently, the temperature of the reactor is raised to about 1000° C., followed by supply of TMG gas, $NH_3$ gas and a carrier gas comprising a mixed gas of nitrogen and hydrogen to the main plane of the GaN substrate 61, along with supply of $Cp_2Mg$ gas and propane ($CH_3CH_2CH_3$) gas thereto. $CH_3CH_2CH_3$ gas is used as a carbon source for doping GaN crystal.

In the above-described initial stage of the crystal growth process the GaN specific semiconductor layer 62 is formed on the GaN substrate 61. In the present embodiment the feed rates and feed durations of respective of $Cp_2Mg$ gas and $CH_3CH_2CH_3$ gas are controlled to allow growth of the GaN specific semiconductor layer 62 having a thickness of about 20 nm, a Mg impurity concentration of about $2 \times 10^{17}$ cm$^{-3}$ and a C impurity concentration of about $1 \times 10^{18}$ cm$^{-3}$. The GaN specific semiconductor layer 62 will serve to absorb light leaking from the active layer 66 toward the GaN substrate 61 side (stray light) during the laser operation.

While the thickness of the GaN specific semiconductor layer 62 is about 20 nm in the present embodiment, there is no particular limitation to this specific layer thickness. The specific semiconductor layer 62 is effective in suppressing stray light leaking out of the GaN substrate and in planarizing unevenness on the surface of the GaN substrate as long as the thickness thereof is about 5 nm or more. Thus, the thickness of the specific semiconductor layer 62 is preferably not less than 5 nm and not more than 200 nm, more preferably not less than 5 nm and not more than 100 nm. If the thickness of the specific semiconductor layer 62 is more than 200 nm, deterioration in crystallinity such as formation of point defects in the crystal and degradation in the flatness of the crystal surface due to the thickened layer will become considerable undesirably.

The Mg impurity concentration in the specific semiconductor layer 62 is preferably not less than $1 \times 10^{17}$ cm$^{-3}$ and not more than $1 \times 10^{18}$ cm$^{-3}$. A Mg impurity concentration of more than $1 \times 10^{18}$ cm$^{-3}$ is not preferable because such a high impurity concentration will degrade the flatness of the crystal surface considerably. The C impurity concentration in the specific semiconductor layer 62 is preferably not less than $2 \times 10^{17}$ cm$^{-3}$ and not more than $5 \times 10^{18}$ cm$^{-3}$. A C impurity concentration of more than $5 \times 10^{18}$ cm$^{-3}$ is not preferable because such a high impurity concentration will degrade the flatness of the crystal surface considerably. While the GaN specific semiconductor layer 62 is formed directly on the GaN substrate 61 in the present embodiment, the GaN specific semiconductor layer 62 may be formed between the GaN substrate 61 and the active layer 66 or between the GaN substrate 61 and the n-type cladding layer 64. Even such an arrangement will exercise an effect to substantially the same extent as the former arrangement in suppressing stray light leaking out of the GaN substrate 61 and in planarizing unevenness on the surface of the GaN substrate 61. In the light of planarization of the surface of the GaN substrate 61, however, the specific semiconductor layer 62 is preferably positioned close to the substrate 61. Though the specific semiconductor layer 62 consists of a single layer in the present embodiment, the specific semiconductor layer 62 may consist of a plurality of such layers formed between the GaN substrate 61 and the active layer 66.

While the Al content in each of the n-type cladding layer 64 and the p-type cladding layer 70 is set to 7% in the present embodiment, it is possible to reduce the Al content to 3-5%. Such a reduction in the Al content of each cladding layer will make it possible to lower the degree of lattice mismatch between GaN and InGaN, relieve the strain on the active layer 66 and hence further improve the reliability of the laser device.

While the present embodiment uses $CH_3CH_2CH_3$ gas as a carbon source for doping GaN crystal, carbon tetrabromide ($CBr_4$) gas may be used instead.

EXAMPLE 3

The laser device 3 according to the above-described third embodiment was fabricated as example 3 and subjected to the following tests (a) to (c).

(a) Measurement of Laser Characteristics

The current-optical output characteristic of the laser device 3 as example 3 was measured under injection of current to the laser device 3. The laser device 3 reached continuous wave oscillation at room temperature under current injection. At that time, a mean value of threshold current and a mean value of slope efficiency were 35 mA and 1.4 W/A, respectively, as with the laser device 1 of example 1.

(b) Measurement of Relative Intensity Noise

The relative intensity noise (RIN) of the laser device 3 varying with varying optical output (1 to 10 mW) was evaluated. Note that for the purpose of reducing noise caused by optical feedback which occurred upon irradiation of an optical disk with laser light, a high-frequency of about 400 MHz was superimposed on the bias (current) applied to the laser device 3 during the RIN measurement. The laser device 3 exhibited RIN of about −135 dB/Hz when the optical output was 2.5 mW.

The laser device 3 can be said to have realized a noise reduction as compared with the laser device 1' as comparative example 1 (see the results of test (c) in the first embodiment). It is estimated that such a noise reduction was achieved by virtue of absorption of spontaneous emission light (stray light) leaking from the active layer 66 toward the GaN substrate 61 side by the GaN specific semiconductor layer 62.

(c) Constant Optical Output Life Test

Samples of laser device 3, each of which exhibited a power consumption (the product of operating current by operating voltage) of about 0.4 W when the optical output was 50 mW, were selected. These samples were subjected to a constant optical output (APC) life test under the conditions: a constant optical output as high as 50 mW and a temperature as high as 60° C. As a result, the samples of laser device 3 exhibited a deterioration rate (operating current increasing rate) of about 0.001 mA per hour and were confirmed to operate stably for not less than 3,000 hours.

Fourth Embodiment

A nitride semiconductor light-emitting device according to a fourth embodiment of the present invention is a GaN-based laser device. The laser device of the present embodiment has the same construction as the laser device 3 of the third embodiment except that the specific GaN semiconductor layer is doped with Si along with Mg and C at the same time. In the present embodiment the feed rates and feed durations of respective of $Cp_2Mg$ gas, $CH_3CH_2CH_3$ gas and $SiH_4$ gas are controlled to allow growth of the GaN specific semiconductor layer having a thickness of about 20 nm, a Mg impurity concentration of about $2 \times 10^{17}$ cm$^{-3}$, a Si impurity concentration of about $1 \times 10^{18}$ cm$^{-3}$, and a C impurity concentration of about $5 \times 10^{17}$ cm$^{-3}$. The GaN specific semiconductor layer will serve to absorb light leaking from the active layer toward the GaN substrate side (stray light) during the laser operation. Since other features and fabrication steps are the same as in the third embodiment, description thereof will be omitted.

While the thickness of the GaN specific semiconductor layer is about 20 nm in the present embodiment, there is no particular limitation to this specific layer thickness. The specific semiconductor layer is effective in suppressing stray light leaking out of the GaN substrate and in planarizing unevenness on the surface of the GaN substrate as long as the thickness thereof is about 5 nm or more. Thus, the thickness of the specific semiconductor layer is preferably not less than 5 nm and not more than 200 nm, more preferably not less than 5 nm and not more than 100 nm. If the thickness of the specific semiconductor layer is more than 200 nm, deterioration in crystallinity such as formation of point defects in the crystal and degradation in the flatness of the crystal surface due to the thickened layer will become considerable undesirably.

The Mg impurity concentration in the specific semiconductor layer is preferably not less than $1 \times 10^{17}$ cm$^{-3}$ and not more than $1 \times 10^{18}$ cm$^{-3}$. A Mg impurity concentration of more than $1 \times 10^{18}$ cm$^{-3}$ is not preferable because such a high impurity concentration will degrade the flatness of the crystal surface considerably. The Si impurity concentration in the specific semiconductor layer is preferably not less than $2 \times 10^{17}$ cm$^{-3}$ and not more than $5 \times 10^{18}$ cm$^{-3}$. A Si impurity concentration of more than $5 \times 10^{18}$ cm$^{-3}$ is not preferable because such a high impurity concentration will degrade the flatness of the crystal surface considerably. Similarly, the C impurity concentration in the specific semiconductor layer is preferably not less than $2 \times 10^{17}$ cm$^{-3}$ and not more than $5 \times 10^{18}$ cm$^{-3}$. While the GaN specific semiconductor layer is formed directly on the GaN substrate in the present embodiment, the GaN specific semiconductor layer may be formed between the GaN substrate and the active layer or between the GaN substrate and the n-type cladding layer. Even such an arrangement will exercise an effect to substantially the same extent as the former arrangement in suppressing stray light leaking out of the GaN substrate and in planarizing unevenness on the surface of the GaN substrate. In the light of planarization of the surface of the GaN substrate, however, the specific semiconductor layer is preferably positioned close to the substrate. Though the specific semiconductor layer consists of a single layer in the present embodiment, the specific semiconductor layer may consist of a plurality of such layers formed between the GaN substrate and the active layer.

While the present embodiment uses $CH_3CH_2CH_3$ gas as a carbon source for doping GaN crystal, carbon tetrabromide ($CBr_4$) gas may be used instead.

EXAMPLE 4

The laser device according to the above-described fourth embodiment was fabricated as example 4 and subjected to the following tests (a) to (c). The results of the tests will be described by comparison with those obtained from the laser device 3 as example 3.

(a) Measurement of Laser Characteristics

The current-optical output characteristic of the laser device as example 4 was measured under injection of current to the laser device. The laser device of example 4 reached continuous wave oscillation at room temperature under current injection. At that time, a mean value of threshold current and a mean value of slope efficiency were 35 mA and 1.4 W/A, respectively, as with the laser device 3.

(b) Measurement of Relative Intensity Noise

The relative intensity noise (RIN) of the laser device of example 4 varying with varying optical output (1 to 10 mW) was evaluated. Note that for the purpose of reducing noise caused by optical feedback which occurred upon irradiation of an optical disk with laser light, a high-frequency of about 400 MHz was superimposed on the bias (current) applied to the laser device during the RIN measurement. The laser device of example 4 exhibited RIN of about −138 dB/Hz when the optical output was 2.5 mW.

The laser device of example 4 achieved a further noise reduction than the laser device 3 because, it is estimated, the GaN specific semiconductor layer of the laser device of example 4 absorbed spontaneous emission light (stray light) leaking out of the active layer toward the GaN substrate more considerably.

(c) Constant Optical Output Life Test

Samples of the laser device of example 4, each of which exhibited a power consumption (the product of operating current by operating voltage) of about 0.4 W when the optical output was 50 mW, were selected. These samples were subjected to a constant optical output (APC) life test under the conditions: a constant optical output as high as 50 mW and a temperature as high as 60° C. As a result, the samples exhibited a deterioration rate (operating current increasing rate) of about 0.001 mA per hour and were confirmed to operate stably for not less than 3,000 hours.

(d) Test for Estimating Optical Absorption at the Specific Semiconductor Layer

A test for estimating optical absorption at the specific semiconductor layer was conducted. There were prepared sample 4 for estimating optical absorption of the laser device 3 of the third embodiment and sample 5 for estimating optical absorption of the laser device of the fourth embodiment.

Sample 4 had a GaN layer having a Mg impurity concentration (about $2 \times 10^{17}$ cm$^{-3}$) and a C impurity concentration (about $1 \times 10^{18}$ cm$^{-3}$), which were equal to respective impurity concentrations in the GaN specific semiconductor layer 62. The GaN layer was grown on GaN substrate 61 according to the same crystal growth method as in the third embodiment. Sample 5 had a GaN layer having a Mg impurity concentration (about $2 \times 10^{17}$ cm$^{-3}$), a C impurity concentration (about $1 \times 10^{18}$ cm$^{-3}$) and a Si impurity concentration (about $1 \times 10^{18}$ cm$^{-3}$), which were equal to respective impurity concentrations in the GaN specific semiconductor layer according to the fourth embodiment. This GaN layer was grown on a GaN substrate according to the same crystal growth method as in the fourth embodiment. While the GaN specific semiconductor layer has a thickness of about 20 nm in each of the third and fourth embodiments, the GaN layer of each of samples 4 and 5 was intentionally formed thicker in this supplemental test for quantitative estimation of the amount of optical absorption; specifically, the thickness of the GaN layer was set to about 500 nm.

Figure 13:
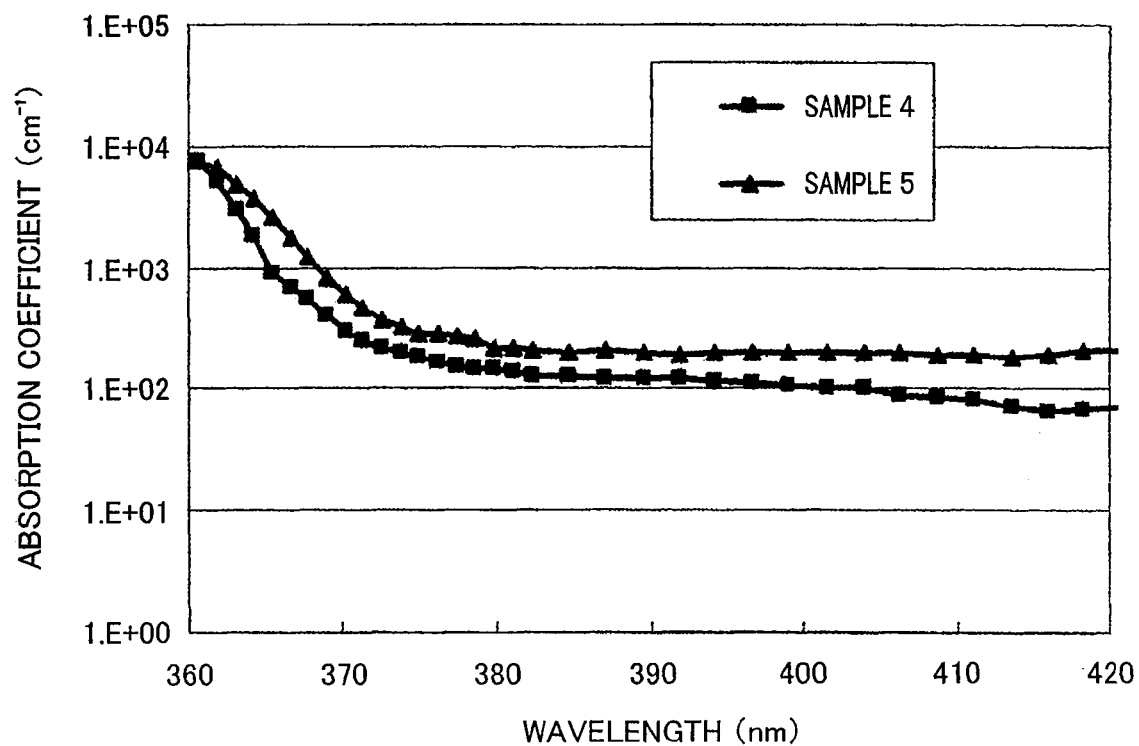
FIG. 13 is a chart plotting the absorption spectra of samples 4 and 5.

The absorption spectra of respective samples 4 and 5 were measured. The measurement was conducted using a xenon (Xe) lamp at an angle such as to suppress optical interference (Brewster angle). FIG. 13 plots the absorption spectra of respective samples 4 and 5 as the results of the measurement. As can be seen from FIG. 13, the absorption coefficient of the sample 4 was about 100 cm$^{-1}$ at an oscillation frequency of 405 nm, which is the oscillation frequency of laser device 3 of the third embodiment. On the other hand, the absorption coefficient of the sample 5 was as high as about 200 cm$^{-1}$ at an oscillation frequency of 405 nm, which is the oscillation frequency of laser device of the fourth embodiment.

The sample 4 having the GaN specific semiconductor layer doped with the p-type impurity along with carbon at the same time absorbed laser light to a very large extent. The sample 5 having the GaN specific semiconductor layer doped with the p-type impurity, carbon and the n-type impurity at the same time absorbed laser light to a larger extent. Thus, each of the samples 4 and 5 was confirmed to have a sufficient effect in absorbing and suppressing light leaking from the active layer toward the GaN substrate side.

It is estimated that the laser light absorption effect of the sample 4 was attributable to simultaneous formation of an acceptor level and a donor level within the bandgap of GaN by Mg and C doped in the GaN layer. It is also estimated that the laser optical absorption effect of the sample 5 was attributable to intricate and simultaneous formation of a multiplicity of acceptor levels and donor levels within the bandgap of GaN by Mg, C and Si doped in the GaN layer.

Fifth Embodiment

Figure 14:
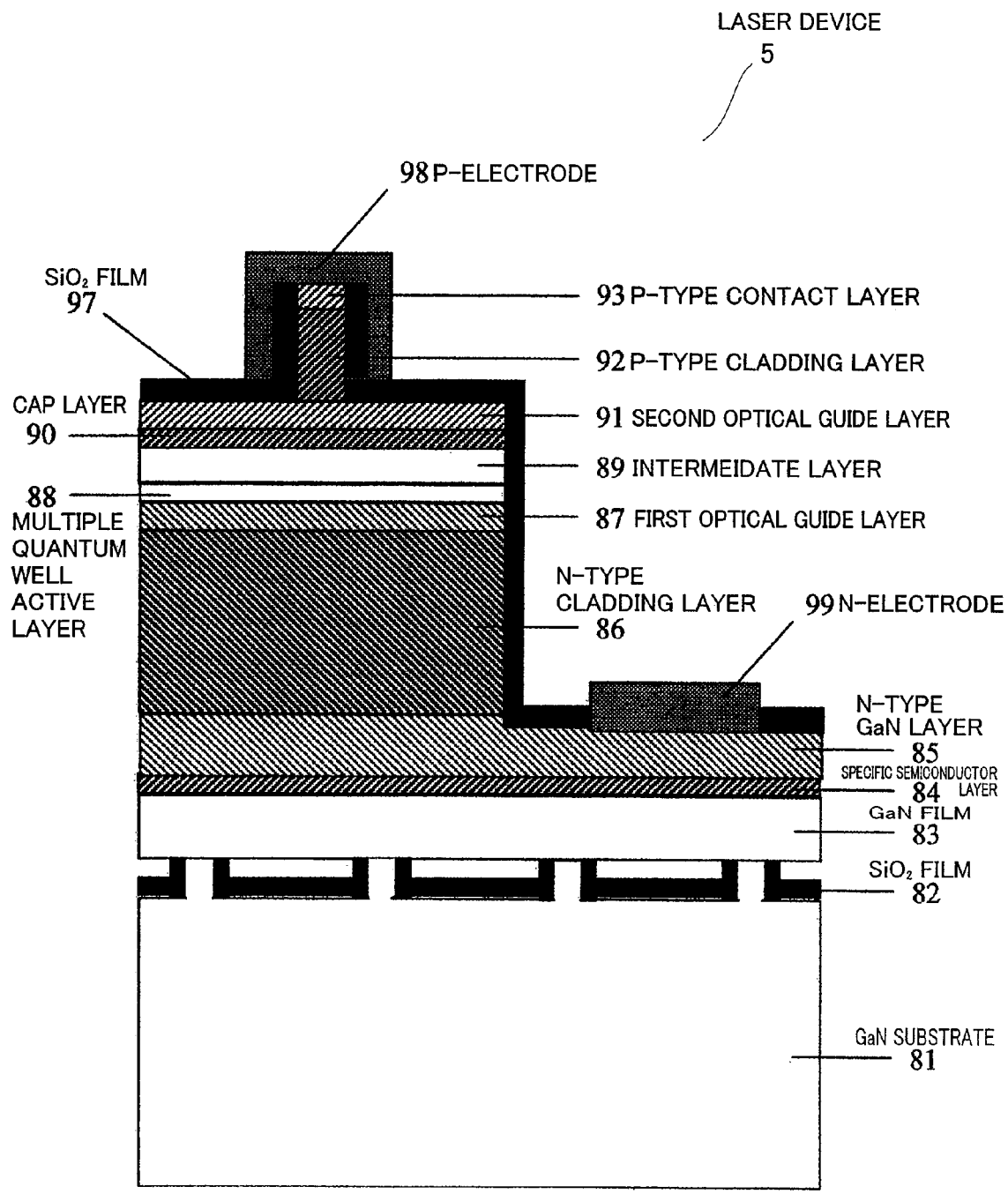
FIG. 14 is a sectional view schematically showing the construction of a laser device according to a fifth embodiment of the present invention.

A nitride semiconductor light-emitting device according to a fifth embodiment of the present invention is a GaN-based laser device. FIG. 14 is a sectional view schematically showing the construction of the laser device 5 according to the present embodiment. As shown in FIG. 14, the laser device 5 has a GaN substrate 81. The GaN substrate 81 has a surface formed with projections and depressions, the depressions being covered with a SiO$_2$ film serving as a masking film for selective growth. The projections of the GaN substrate 81 have exposed GaN portions over which a GaN film 83 is selectively grown laterally. On the GaN film 83 there are stacked in the following order a specific semiconductor layer 84 comprising GaN doped with Mg, an n-type GaN layer 85, an n-type cladding layer 86 comprising n-type $Al_{0.07}Ga_{0.93}N$, a first optical guide layer 87 comprising n-type GaN, a multiple quantum well active layer 88 comprising $In_{0.10}Ga_{0.90}N$/$In_{0.02}Ga_{0.98}N$, an intermediate layer 89 comprising $In_{0.02}Ga_{0.98}N$, a cap layer 90 comprising p-type $Al_{0.18}Ga_{0.82}N$, a second optical guide layer 91 comprising p-type GaN, a p-type cladding layer 92 comprising p-type $Al_{0.07}Ga_{0.93}N$, and a p-type contact layer 93 comprising p-type GaN. In a specified region the layers lying above the active layer 88 are partially removed. The layers remaining in the unremoved region form a ridge. A $SiO_2$ film 97 is deposited over the surface of the structure except the top surface of the ridge. A p-electrode 98 comprising palladium (Pd), platinum (Pt) and gold (Au) is formed to extend over the ridge and the $SiO_2$ film 97, while an n-electrode 99 comprising titanium (Ti), platinum (Pt) and gold (Au) formed on an exposed portion of the n-type GaN layer 85. The projections and depressions on the upper surface of the GaN substrate 81 except the top surfaces of the projections are covered with the $SiO_2$ film. The structure of the GaN substrate 81 will be described in detail later.

Figure 15:
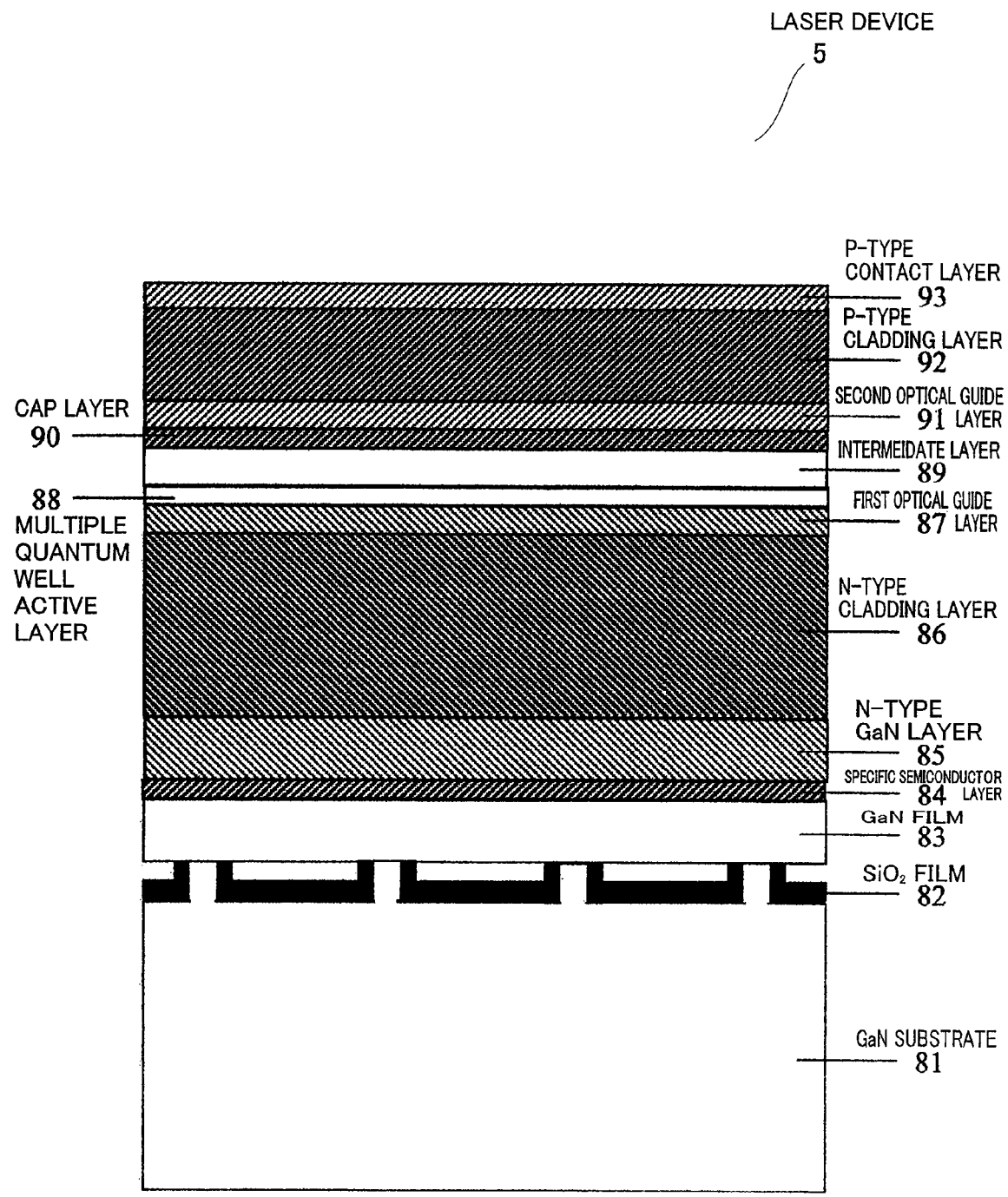
FIG. 15 is a sectional view schematically showing the structure of the laser device according to the fifth embodiment in a state where the fabrication process has proceeded until completion of the crystal growth process.
Figure 16:
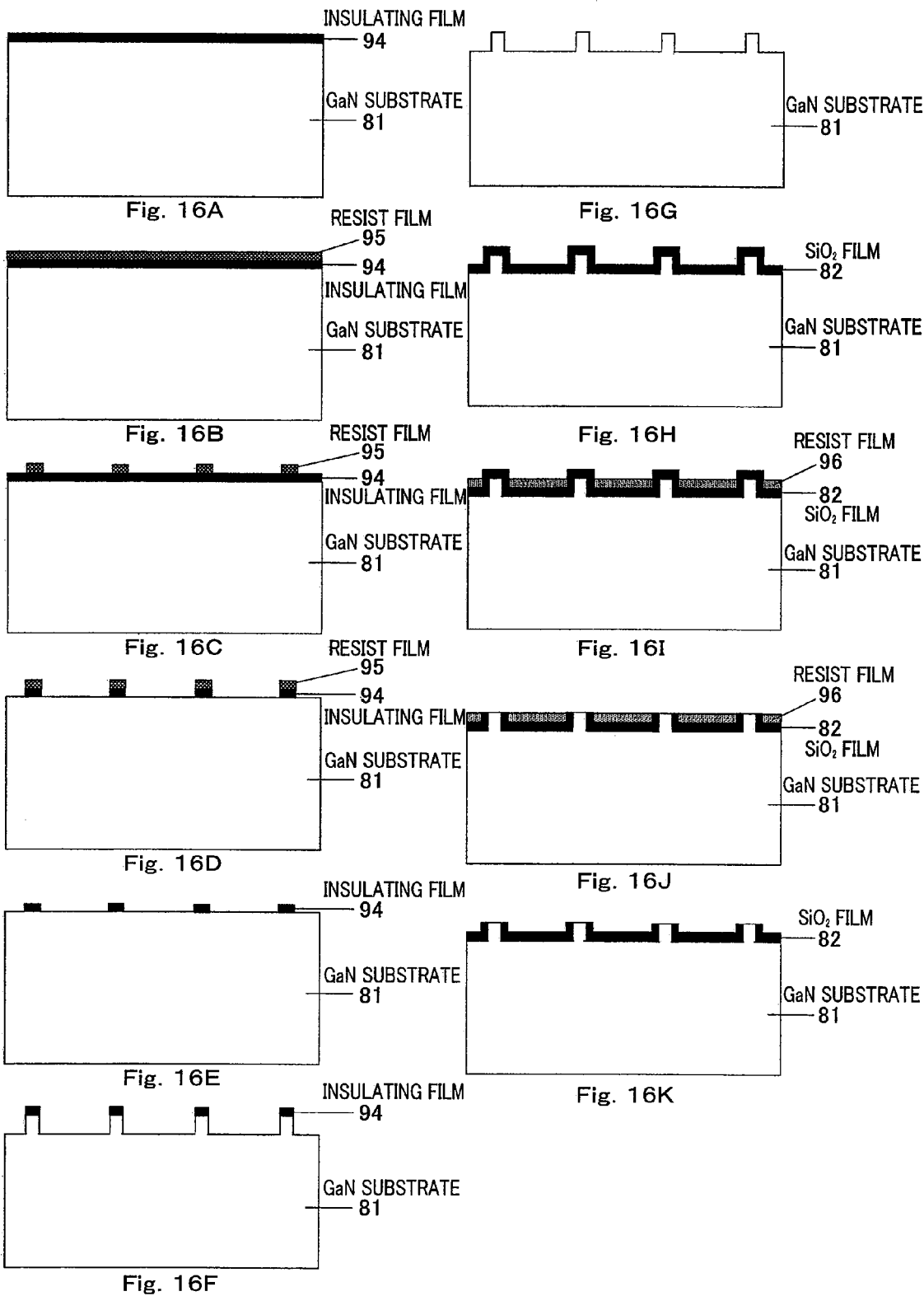
FIGS. 16A to 16K are sectional views schematically illustrating the steps of processing a GaN substrate according to the fifth embodiment.

The following description is directed to a fabrication method of the laser device 5 according to the present embodiment. FIG. 15 is a sectional view schematically showing the structure of the laser device 5 in a state where the fabrication process has proceeded until completion of the crystal growth process; and FIGS. 16A to 16K are sectional views schematically illustrating the steps of processing the GaN substrate 81. As shown in FIG. 16A, an insulating film 94 comprising $SiO_2$ is deposited over the GaN substrate 81 having plane (0001) as its main plane by sputtering. Subsequently, a resist film 95 is deposited as shown in FIG. 16B, and then the resist film 95 is shaped into a periodic line-and-space pattern having an opening width of 15 μm and a mask width of 3 μm by photolithography, so that resist film 95 remains only as a mask having the mask width of 3 μm as shown in FIG. 16C. Thereafter, a portion of the $SiO_2$ film 94 lying within the resist-removed region is removed with a hydrofluoric acid solution using resist film 95 as an etching mask, so that a portion of the main plane of the GaN substrate 81 in that region is exposed as shown in FIG. 16D.

After having removed resist film 95 with an acetone solution as shown in FIG. 16E, the GaN substrate 81 is etched to a depth of about 1 μm by dry etching using $SiO_2$ film 94 as a mask so that periodic projections and depressions are formed on the main plane of the GaN substrate 81 as shown in FIG. 16F. Subsequently, $SiO_2$ film 94 on the projections of the GaN substrate 81 is removed with a hydrofluoric acid solution as shown in FIG. 16G. Subsequently, a $SiO_2$ film 82 is deposited by sputtering on the projecting and depressed main plane of the GaN substrate 81 as a masking film for selective growth as shown in FIG. 16H. The $SiO_2$ film 82 thus formed is coated with a resist film 96, which in turn is etched back to expose only a portion of the $SiO_2$ film 82 lying on the projections as shown in FIG. 16I. Subsequently, a portion of $SiO_2$ film 82 on the projections present in the resist-removed region is removed with a hydrofluoric acid solution using resist film 96 as an etching mask, so that a portion of the main plane of the GaN substrate 81 in that region is exposed as shown in FIG. 16J. Thereafter, the resist film 96 is removed with an acetone solution as shown in FIG. 16K. As a result, the projections and depressions on the main plane of the GaN substrate 81 except the top surfaces of the projections are covered with $SiO_2$ film 82.

Next, the process proceeds to the crystal growth process. The above-described GaN substrate 81 is held on a susceptor within a reactor of metal organic vapor phase epitaxy (MOVPE) equipment and then the reactor is evacuated to vacuum. Subsequently, the reactor is charged with a nitrogen atmosphere to a pressure of 300 Torr and then the temperature within the reactor is raised to about 800° C. to heat the GaN substrate 81 for thermal cleaning of the surface thereof. This thermal cleaning step can remove foreign matter and oxides remaining on the surface of the GaN substrate 81. This step may use a mixed atmosphere comprising nitrogen and hydrogen produced by addition of hydrogen.

Subsequently, the temperature of the reactor is raised to about 1000° C., followed by supply of TMG gas at a feed rate of 7 sccm, $NH_3$ gas at a feed rate of 7.5 slm and a carrier gas comprising a mixed gas of nitrogen and hydrogen to the GaN substrate 81. At this stage crystal growth of the GaN film 83 starts from the top surface (in the $SiO_2$ film removed region) of the substrate 81 selectively. The GaN film 83 then grows parallel with the substrate 81 by ELO while forming a space (air gap) within each depression and, finally, growing edges of the GaN film 83 join with each other at a location adjacent the center of each depression thereby planarizing the GaN film 83.

The aforementioned ELO technique employed for selective crystal growth from minutely localized regions on the GaN substrate 81 makes it possible to reduce the influence of unevenness formed on the main plane of the GaN substrate 81 by polishing flaw such as scratch.

In the subsequent step of the crystal growth process the p-type GaN specific semiconductor layer 84 is formed on the GaN film 83. In the present embodiment the feed rate and feed duration of $Cp_2Mg$ gas are controlled to allow growth of the p-type GaN specific semiconductor layer 84 having a thickness of about 20 nm and a Mg impurity concentration of about $2\times10^{17}$ $cm^{-3}$. The p-type GaN specific semiconductor layer 84 will serve to absorb light leaking from the active layer 88 toward the GaN substrate 81 side (stray light) during the laser operation.

In turn, with only the supply of $Cp_2Mg$ gas stopped, $SiH_4$ gas is supplied to allow growth of the n-type GaN layer 85 having a thickness of about 3 μm and a Si impurity concentration of about $5\times10^{17}$ $cm^{-3}$. Subsequently, TMA is also supplied to allow growth of the n-type cladding layer 86 having a thickness of about 1.2 μm and comprising n-type $Al_{0.07}Ga_{0.93}N$ having a Si impurity concentration of about $5\times10^{17}$ $cm^{-3}$. Subsequently, the first optical guide layer 87 having a thickness of about 120 nm and comprising n-type GaN having a Si impurity concentration of about $5\times10^{17}$ $cm^{-3}$ is grown. Thereafter, with the temperature lowered to about 800° C. and with the carrier gas changed to comprise nitrogen only, trimethyl indium (TMI) and TMG are supplied to allow growth of the multiple quantum well active layer 88 consisting of quantum well layers (three layers) each having a thickness of about 3 nm and comprising $In_{0.10}Ga_{0.90}N$ and barrier layers (two layers) each having a thickness of about 7 nm and comprising $In_{0.02}Ga_{0.98}N$.

Subsequently, the intermediate layer 89 having a thickness of about 100 nm and comprising $In_{0.02}Ga_{0.98}N$ is grown. The intermediate layer 89 is an undoped layer not containing any impurity. The intermediate layer 89 will serve to prevent contamination of the active layer 88 by Mg as a p-type dopant due to diffusion or the like as well as to reduce an optical absorption loss caused by Mg during the laser operation.

Thereafter, with the temperature within the reactor raised to about 1000° C. again and with the carrier gas mixed with hydrogen, $Cp_2Mg$ gas and TMG gas are supplied and then TMA gas also supplied, thereby allowing growth of the cap layer 90 having a thickness of about 20 nm and comprising p-type $Al_{0.18}Ga_{0.82}N$ having a Mg impurity concentration of about $1\times10^{19}$ $cm^{-3}$.

In the present embodiment the supply of $Cp_2Mg$ gas is started before the growth of the cap layer 90. A p-type AlGaN layer is known to have increasing resistance with increasing Al content, like the cap layer 90. Further, in some cases where the reactor tube of the MOVPE equipment is formed from quartz, Mg supplied into the reactor tube reacts with quartz, with the result that the resulting semiconductor has an undesired Mg concentration (memory effect). For this reason, by starting the supply of $Cp_2Mg$ gas before the growth of the cap layer 90 as in the present embodiment, it is possible to lessen Mg doping delay due to the aforementioned memory effect, hence, suppress the increase in the resistance of the cap layer 90. The aforementioned memory effect can be further suppressed by supplying a larger amount of $Cp_2Mg$ gas before the growth of the cap layer 90 than the amount of $Cp_2Mg$ gas to be supplied during the growth of the cap layer 90. The cap layer 90 will serve to prevent evaporation of 1n from the active layer 88 during the subsequent growth of the p-type cladding layer as well as overflow of electrons injected from an n-type layer to the active layer during current injection toward a p-type layer.

While the thickness of the cap layer 90 is about 20 nm in the present embodiment, there is no particular limitation to this specific layer thickness. Because the cap layer 90 exhibits a considerable electron-overflow preventive effect until its thickness decreases to about 10 nm, the thickness of the cap layer 90 is preferably not less than 10 nm. While the present embodiment sets the Al content in the cap layer 90 to 18%, there is no limitation to this value of Al content. Because the electron-overflow preventive effect is considerable until the Al content in the cap layer 90 decreases to about 10%, the Al content in the cap layer 90 is preferably not less than 10%.

In turn, the second optical guide layer 91 comprising p-type GaN having a Mg impurity concentration of about $1\times10^{19}$ cm$^{-3}$ is grown to a thickness of about 100 nm. Subsequently, the p-type cladding layer 92 comprising p-type $Al_{0.07}Ga_{0.93}N$ having a Mg impurity concentration of about $1\times10^{19}$ cm$^{-3}$ is grown to a thickness of about 0.5 µm. Finally, the p-type contact layer 93 comprising p-type GaN having a Mg impurity concentration of about $1\times10^{19}$ cm$^{-3}$ is grown to a thickness of about 60 nm. Here, preferably, the Mg concentration of the p-type contact layer 93 in an uppermost portion having a depth of about 10 nm from the surface is further increased (to about $1\times10^{20}$ cm$^{-3}$ for example). By so doing, the contact resistance of the contact layer 93 to the p-electrode 23 can be substantially reduced, which will contribute to a decrease in the operating voltage of the laser device 5, hence, to prolongation of the lifetime of the laser device 5.

The subsequent process steps including formation of the electrodes are the same as in the first embodiment except formation of a ridge structure just above a low dislocation-density region of the GaN film 83 and formation of the n-electrode 99 on the same side as the p-type electrode 98. The ridge structure is formed just above the low dislocation-density region of the GaN film 83 because if a region of the active layer just below the ridge portion to be fed with current during the laser operation is low in dislocation density, non-radiative recombination due to dislocation is suppressed and, hence, leakage current not contributing to emission of light decreases, which results in a prolonged lifetime. The n-electrode 99 is formed on the same side as the p-electrode 98 because if the n-electrode 99 is formed on the polished side of the substrate 81, current path is restricted due to the presence of spaces (air gaps) between the GaN substrate 81 and the GaN film 83, thus resulting in a considerable increase in operating voltage.

While the spaces (air gaps) are formed to lower the dislocation density in the present embodiment, it is possible to form a low dislocation-density GaN film by selective ELO on a GaN substrate not formed with projections and depressions but only an insulating film thereon.

While the thickness of the p-type GaN specific semiconductor layer 84 is about 20 nm in the present embodiment, there is no particular limitation to this specific layer thickness. The specific semiconductor layer is effective in suppressing stray light leaking out of the GaN substrate and in planarizing unevenness on the surface of the GaN film 83 as long as the thickness thereof is about 5 nm or more. Thus, the thickness of the specific semiconductor layer 84 is preferably not less than 5 nm and not more than 200 nm, more preferably not less than 5 nm and not more than 100 nm. If the thickness of the specific semiconductor layer 84 is more than 200 nm, deterioration in crystallinity such as formation of point defects in the crystal and degradation in the flatness of the crystal surface will become considerable undesirably.

The Mg impurity concentration in the specific semiconductor layer 84 is preferably not less than $1\times10^{17}$ cm$^{-3}$ and not more than $1\times10^{18}$ cm$^{-3}$. A Mg impurity concentration of more than $1\times10^{18}$ cm$^{-3}$ is not preferable because such a high impurity concentration will degrade the flatness of the crystal surface considerably.

While the p-type GaN specific semiconductor layer 84 is formed on the GaN film 83 in the present embodiment, there is no limitation to this arrangement. Though the specific semiconductor layer 84 consists of a single layer in the present embodiment, the specific semiconductor layer 84 may consist of a plurality of such layers formed between the GaN substrate 81 and the active layer 88.

Figure 17:
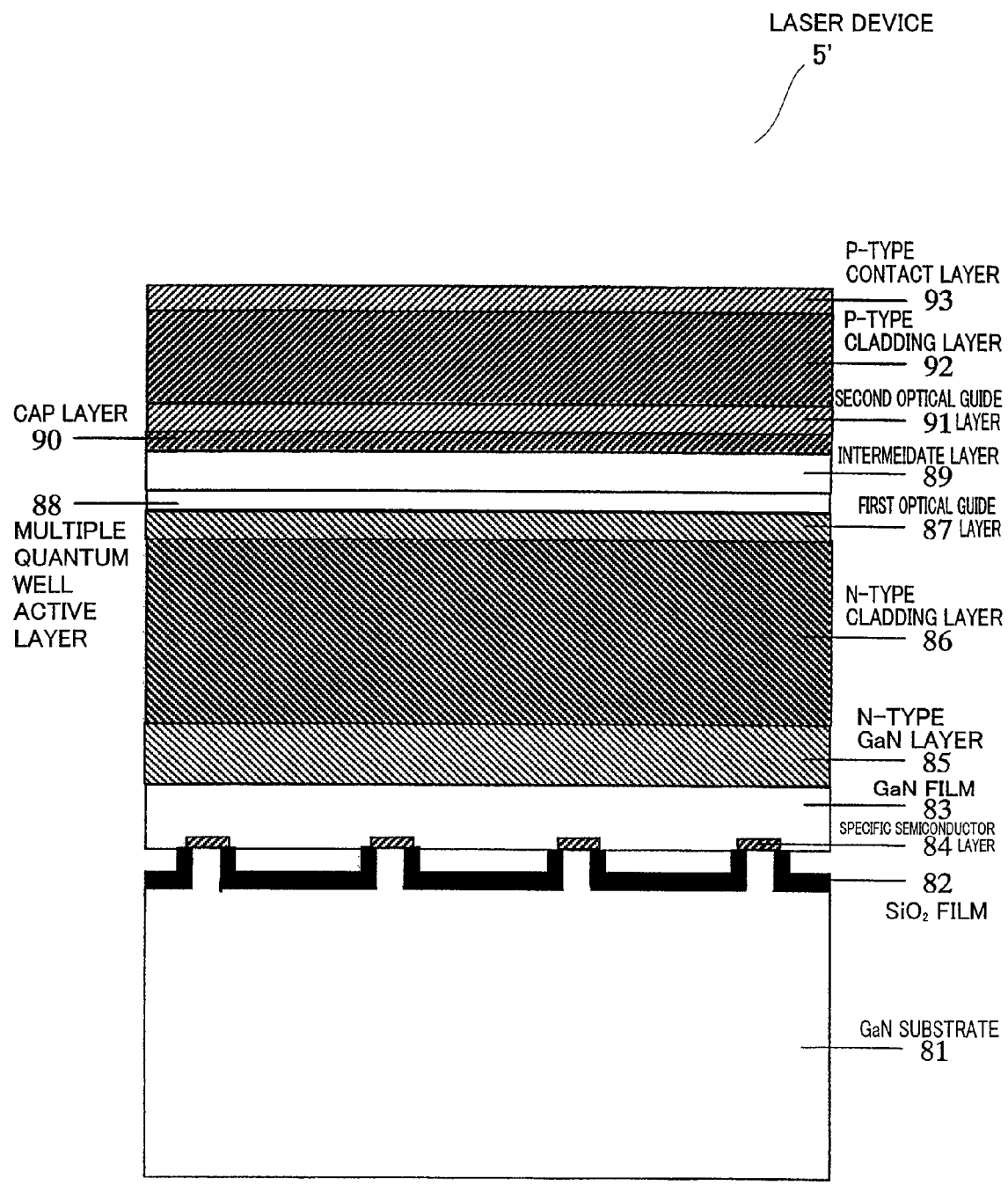
FIG. 17 is a sectional view schematically showing the structure of a laser device which is different from that of the laser device shown in FIG. 15 according to the fifth embodiment in a state where the fabrication process has proceeded until completion of the crystal growth process.

FIG. 17 shows a laser device 5' having specific semiconductor layer 84 positioned different from that of the laser device 5. FIG. 17 is a sectional view showing the structure of the laser device 5' in a state where the fabrication process has proceeded until completion of the crystal growth process. By positioning the p-type GaN specific semiconductor layer 84 on the top surfaces of projections formed on the GaN substrate 81 as shown in FIG. 17, planarization of the surface of GaN film 83 can be facilitated from the initial stage of growth of the GaN film 83, thus leading to improvement in laser characteristics.

The p-type GaN specific semiconductor layer 84 may be doped with Si and C along with Mg at the same time as in the second or third embodiment. Even such an arrangement can exercise a sufficient stray light suppressing effect.

While the Al content in each of the n-type cladding layer 86 and the p-type cladding layer 92 is set to 7% in the present embodiment, it is possible to reduce the Al content to 3-5%. Such a reduction in the Al content of each cladding layer will make it possible to lower the degree of lattice mismatch between GaN and InGaN, relieve the strain on the active layer 88 and hence further improve the reliability of the laser device.

EXAMPLE 5

Laser device 5 according to the above-described fifth embodiment was fabricated as example 5 and subjected to the following tests (a) to (e).

(a) Measurement of the Threading Dislocation Density of the GaN Film

According to dislocation density estimation by the cathode luminescence method using a SEM, the projections of the substrate 81 had dark points in a density of about $2\times10^6$ cm$^{-2}$, whereas the depressions of the substrate 81 had dark points in a density of about $7\times10^{14}$ cm$^{-2}$. (A dislocation is observed as a dark point.) As can be understood from this result, a region of the GaN film 83 coinciding with each projection of the substrate 81 took over defects (threading dislocations) of the substrate 81, whereas an ELO region of the GaN film 83 coinciding with each depression had markedly decreased dislocations.

(b) Observation of a Section of a Stack of Crystal Layers with a Transmission Electron Microscope A section of a stack of crystal layers in the laser device 5 as example 5 was observed by a transmission electron microscope (TEM) after the crystal growth process of the fabrication process had been completed. (The observed section is not shown.) As a result, the GaN film 83 was observed to have unevenness on its surface due to selective growth (ELO), whereas the p-type GaN specific semiconductor layer 84 observed to have substantially reduced unevenness on its surface.

It is estimated that doping with Mg during the growth of GaN crystal on the GaN film 83 facilitated epitaxial lateral overgrowth (ELO) parallel with the substrate, with the result that unevenness on the surface of the GaN film 83 was planarized during the initial stage of the growth process. Such planarization of the crystal surface results in planarization of the quantum well layer as the active layer 88, which will enhance the quantum effect considerably, thus contributing to improvements in the laser characteristics such as lowering of the threshold current.

(c) Measurement of Laser Characteristics

The current-optical output characteristic of the laser device 5 was measured under injection of current to the laser device. The laser device 5 reached continuous wave oscillation at room temperature under current injection. At that time, a mean value of threshold current and a mean value of slope efficiency were 30 mA and 1.5 W/A, respectively. It is estimated that as a result of a decrease in dislocation density as compared with the laser device 1 of example 1 the laser characteristics were improved.

(d) Measurement of Relative Intensity Noise

The relative intensity noise (RIN) of the laser device 5 varying with varying optical output (1 to 10 mW) was evaluated. Note that for the purpose of reducing noise caused by optical feedback which occurred upon irradiation of an optical disk with laser light, a high-frequency of about 400 MHz was superimposed on the bias (current) applied to the laser device during the RIN measurement. Like the laser device 1 of example 1, the laser device 5 exhibited RIN of about −135 dB/Hz when the optical output was 2.5 mW. The laser device 5 achieved such a noise reduction (as compared with the laser device 1' of comparative example 1 for example) because, it is estimated, the p-type GaN specific semiconductor layer 84 absorbed spontaneous emission light (stray light) leaking from the active layer 88 toward the GaN substrate 81 side.

(e) Constant Optical Output Life Test

Samples of laser device 5, each of which exhibited a power consumption (the product of operating current by operating voltage) of about 0.4 W when the optical output was 50 mW, were selected. These samples were subjected to a constant optical output (APC) life test under the conditions: a constant optical output as high as 50 mW and a temperature as high as 60° C. As a result, the samples of laser device 5 exhibited a deterioration rate (operating current increasing rate) of about 0.001 mA or less per hour and were confirmed to operate stably for not less than 5,000 hours. It is estimated that the introduction of the GaN specific semiconductor layer 84 made it possible to substantially improve the flatness of the surface of the GaN film 83 (by virtue of the planarizing effect produced by Mg-doping) and hence solve the problems of degraded laser characteristics and lowered yield.

Each of the specific semiconductor layers 12, 42, 62 and 84 according to respective of the foregoing embodiments may be further doped with oxygen (O). In such a case Mg causes oxidation to enhance the optical absorption effect, thereby exercising a further enhanced stray light suppressing effect.

The present invention makes it possible to provide a nitride semiconductor light-emitting device such as a GaN-based light-emitting device fabricated by crystal growth on a GaN substrate, particularly a GaN-based laser which realizes reduction in noise by reducing light leaking out of the substrate (stray light), which ensures improved laser characteristics and improved yield by facilitating planarization of a crystal surface of the laser, and which can enjoy a prolonged lifetime even under high temperature and high optical output operating conditions.

It will be apparent from the foregoing description that many improvements and other embodiments of the present invention occur to those skilled in the art. Therefore, the foregoing description should be construed as an illustration only and is provided for the purpose of teaching the best mode for carrying out the present invention to those skilled in the art. The details of the structure and/or the function of the present invention can be modified substantially without departing from the spirit of the present invention.

What is claimed is:

1. A nitride semiconductor laser device comprising:
an n-electrode;
a substrate comprising gallium nitride (GaN) adapted to be electrically connected to the n-electrode;
a semiconductor layer comprising gallium nitride (GaN) containing magnesium (Mg) formed on the substrate;
a first cladding layer comprising an n-type nitride semiconductor, the first cladding layer being formed on the semiconductor layer;
an active layer formed on the first cladding layer;
a second cladding layer comprising a p-type nitride semiconductor, the second cladding layer being formed on the active layer; and
a p-electrode formed above the second cladding layer,
wherein a Mg impurity concentration in the semiconductor layer is not less than $1 \times 10^{17}$ cm$^{-3}$ and not more than $1 \times 10^{18}$ cm$^{-3}$.

2. The nitride semiconductor laser device according to claim 1, wherein the substrate is directly on the n-electrode.

3. The nitride semiconductor laser device according to claim 2, wherein the semiconductor layer is directly on the substrate.

4. The nitride semiconductor laser device according to claim 3, wherein the semiconductor layer contains silicon (Si).

5. The nitride semiconductor laser device according to claim 4, wherein a Si impurity concentration in the semiconductor layer is not less than $2 \times 10^{17}$ cm$^{-3}$ and not more than $5 \times 10^{18}$ cm$^{-3}$.

6. The nitride semiconductor laser device according to claim 5, wherein the semiconductor layer contains carbon (C).

7. The nitride semiconductor laser device according to claim 6, wherein a C impurity concentration in the semiconductor layer is not less than $2 \times 10^{17}$ cm$^{-3}$ and not more than $5 \times 10^{18}$ cm$^{-3}$.

8. The nitride semiconductor laser device according to claim 1, wherein the semiconductor layer has a thickness of not less than 5 nm and not more than 200 nm.

9. The nitride semiconductor laser device according to claim 1, wherein the semiconductor layer contains carbon (C).

10. The nitride semiconductor laser device according to claim 9, wherein a C impurity concentration in the semiconductor layer is not less than $2 \times 10^{17}$ cm$^{-3}$ and not more than $5 \times 10^{18}$ cm$^{-3}$.

* * * * *